(12) United States Patent
Uchida et al.

(10) Patent No.: US 10,446,543 B2
(45) Date of Patent: Oct. 15, 2019

(54) SEMICONDUCTOR DEVICE AND METHOD OF MANUFACTURING SEMICONDUCTOR DEVICE

(71) Applicant: Renesas Electronics Corporation, Koutou-ku, Tokyo (JP)

(72) Inventors: Shinichi Uchida, Tokyo (JP); Takafumi Kuramoto, Tokyo (JP); Yasutaka Nakashiba, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/796,816

(22) Filed: Oct. 29, 2017

(65) Prior Publication Data
US 2018/0182751 A1    Jun. 28, 2018

(30) Foreign Application Priority Data
Dec. 26, 2016    (JP) .................................. 2016-251302

(51) Int. Cl.
| | |
|---|---|
| *H01L 29/06* | (2006.01) |
| *H01L 27/06* | (2006.01) |
| *H01L 29/94* | (2006.01) |
| *H01L 21/84* | (2006.01) |
| *H01L 23/522* | (2006.01) |
| *H01L 23/528* | (2006.01) |

(Continued)

(52) U.S. Cl.
CPC .......... *H01L 27/0629* (2013.01); *H01L 21/84* (2013.01); *H01L 23/485* (2013.01); *H01L 23/528* (2013.01); *H01L 23/5226* (2013.01); *H01L 27/1207* (2013.01); *H01L 29/0649* (2013.01); *H01L 29/66174* (2013.01); *H01L 29/93* (2013.01); *H01L 29/94* (2013.01)

(58) Field of Classification Search
CPC ..... H01L 2924/1306; H01L 21/823878; H01L 21/84; H01L 27/0922; H01L 27/1203
See application file for complete search history.

(56) References Cited

U.S. PATENT DOCUMENTS

| | | |
|---|---|---|
| 6,188,122 B1 | 2/2001 | Davari et al. |
| 7,729,096 B2 | 6/2010 | Hayashi |

(Continued)

FOREIGN PATENT DOCUMENTS

| | | |
|---|---|---|
| JP | 2008-235310 A | 10/2008 |
| JP | 2009-064860 A | 3/2009 |

OTHER PUBLICATIONS

Extended European Search Report dated Sep. 28, 2018, in European Patent Application No. 17198689.6.

*Primary Examiner* — Jaehwan Oh
(74) *Attorney, Agent, or Firm* — Shapiro, Gabor and Rosenberger, PLLC

(57) ABSTRACT

A semiconductor device of the present invention includes, in a region 1C, a top electrode made by a semiconductor layer of an SOI substrate, a capacitive insulating film made by an insulating layer, a bottom electrode made by a supporting board, and a lead part (a high-concentration impurity region of an n type) of the bottom electrode coupled to the supporting board. An SOI transistor in a region 1B is formed over a main surface of the semiconductor layer over the insulating layer as a thin film, and threshold voltage can be adjusted by applying a voltage to a well arranged on the rear face side of the insulating layer.

15 Claims, 27 Drawing Sheets

(51) Int. Cl.
*H01L 27/12* (2006.01)
*H01L 29/66* (2006.01)
*H01L 29/93* (2006.01)
*H01L 23/485* (2006.01)

(56) References Cited

U.S. PATENT DOCUMENTS

| | | | | |
|---|---|---|---|---|
| 8,299,519 | B2 * | 10/2012 | Chou | H01L 21/84 |
| | | | | 257/315 |
| 8,669,146 | B2 * | 3/2014 | Abou-Khalil | H01L 27/0266 |
| | | | | 257/E21.409 |
| 9,748,270 | B2 * | 8/2017 | Faul | H01L 27/1203 |
| 9,929,148 | B1 * | 3/2018 | Baars | H01L 27/0629 |
| 2004/0195626 | A1 | 10/2004 | Yamada et al. | |
| 2008/0225450 | A1 * | 9/2008 | Hayashi | H01L 27/0266 |
| | | | | 361/56 |
| 2009/0057746 | A1 * | 3/2009 | Sugll | H01L 21/82385 |
| | | | | 257/315 |
| 2009/0230447 | A1 | 9/2009 | Hwang | |
| 2016/0148929 | A1 * | 5/2016 | Lee | H01L 27/0288 |
| | | | | 257/531 |
| 2016/0204129 | A1 | 7/2016 | Hoentschel et al. | |
| 2016/0379993 | A1 * | 12/2016 | Faul | H01L 27/1203 |
| | | | | 257/312 |
| 2017/0263328 | A1 * | 9/2017 | Maekawa | H01L 23/5252 |

* cited by examiner

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2016-251302 filed on Dec. 26, 2016 including the specification, drawings and abstract is incorporated herein by reference in its entirety.

BACKGROUND

The present invention relates to a semiconductor device and, more particularly, relates to a technique effectively applied to a semiconductor device using an SOI substrate and a method of manufacturing the same.

As an MISFET in which short-channel characteristics and element variations can be suppressed, an MISFET using an SOI substrate is used. The SOI substrate has a supporting board made of Si (silicon) or the like, an insulating layer (also called a BOX (Buried Oxide) layer) over the supporting board, and a thin semiconductor layer made of Si or the like over the insulating layer. An MISFET is formed by using the semiconductor layer. Such an MISFET can adjust the threshold voltage by applying voltage to the rear face side of the insulating layer.

In some cases, in such an SOI substrate, the MISFET and other elements are mixedly provided.

For example, patent literature 1 (Japanese Unexamined Patent Application Publication No. 2008-235310) discloses a semiconductor device having an ESD protection transistor. It also discloses that the total capacitance of a transistor for capacitance between a drain electrode of an ESD protection transistor and a bulk substrate is a function of the capacitance of a gate oxide film, the depletion layer capacitance of an SOI layer, and the capacitance of an insulating layer.

Patent literature 2 (Japanese Unexamined Patent Application Publication No. 2009-64860) discloses a semiconductor device having an MOS varactor formed in a main surface of an SOI substrate. The MOS varactor has a gate insulating film formed in a surface of an SOI layer, a gate electrode formed over the gate insulating film, and an n+type semiconductor region formed in the SOI layer on both sides of the gate electrode.

SUMMARY

The inventors of the present invention are engaged in research and development of a semiconductor device using an SOI (Silicon On Insulator) substrate as described above and are keenly examining improvement of the characteristics of the semiconductor device. With respect to a capacitive element mounted mixedly with an MISFET over the SOI substrate, examination of a configuration by which large capacitance can be easily assured is demanded.

The other subjects and novel features will become apparent from the description of the specification and the appended drawings.

Outline of representative ones of embodiments disclosed in the application will be briefly described as follows.

A semiconductor device described in an embodiment disclosed in the present invention has a top electrode made by a semiconductor layer in an SOI substrate, a capacitance insulating film made by an insulating layer, a bottom electrode made by a supporting board, and a lead part of the bottom electrode coupled to the supporting board.

A semiconductor device described in an embodiment disclosed in the present invention includes a gate electrode formed over a semiconductor layer in an SOI substrate via a gate insulating film, a source/drain region formed in the semiconductor layer on both sides of the gate electrode, and a lead part of a bottom electrode coupled to a supporting board. The lead part of the bottom electrode is provided for the supporting board and provided in the semiconductor region containing impurity of the same conduction type as that of the source/drain region, and a lower part of the semiconductor region is covered with another semiconductor region containing impurity of a conduction type opposite to that of the semiconductor region.

A method of manufacturing a semiconductor device according to an embodiment disclosed in the present invention has steps of forming a top electrode made by a semiconductor layer of an SOI substrate, a capacitance insulating film made by an insulating layer, a bottom electrode made by a supporting board, and a lead part of the bottom electrode coupled to the supporting board.

According to the semiconductor device described in the following representative embodiment disclosed in the present invention, the characteristics of the semiconductor device can be improved.

According to the method of manufacturing the semiconductor device described in the representative embodiment disclosed in the present invention, the semiconductor device with the excellent characteristics can be manufactured.

DETAILED DESCRIPTION

Figure 1:
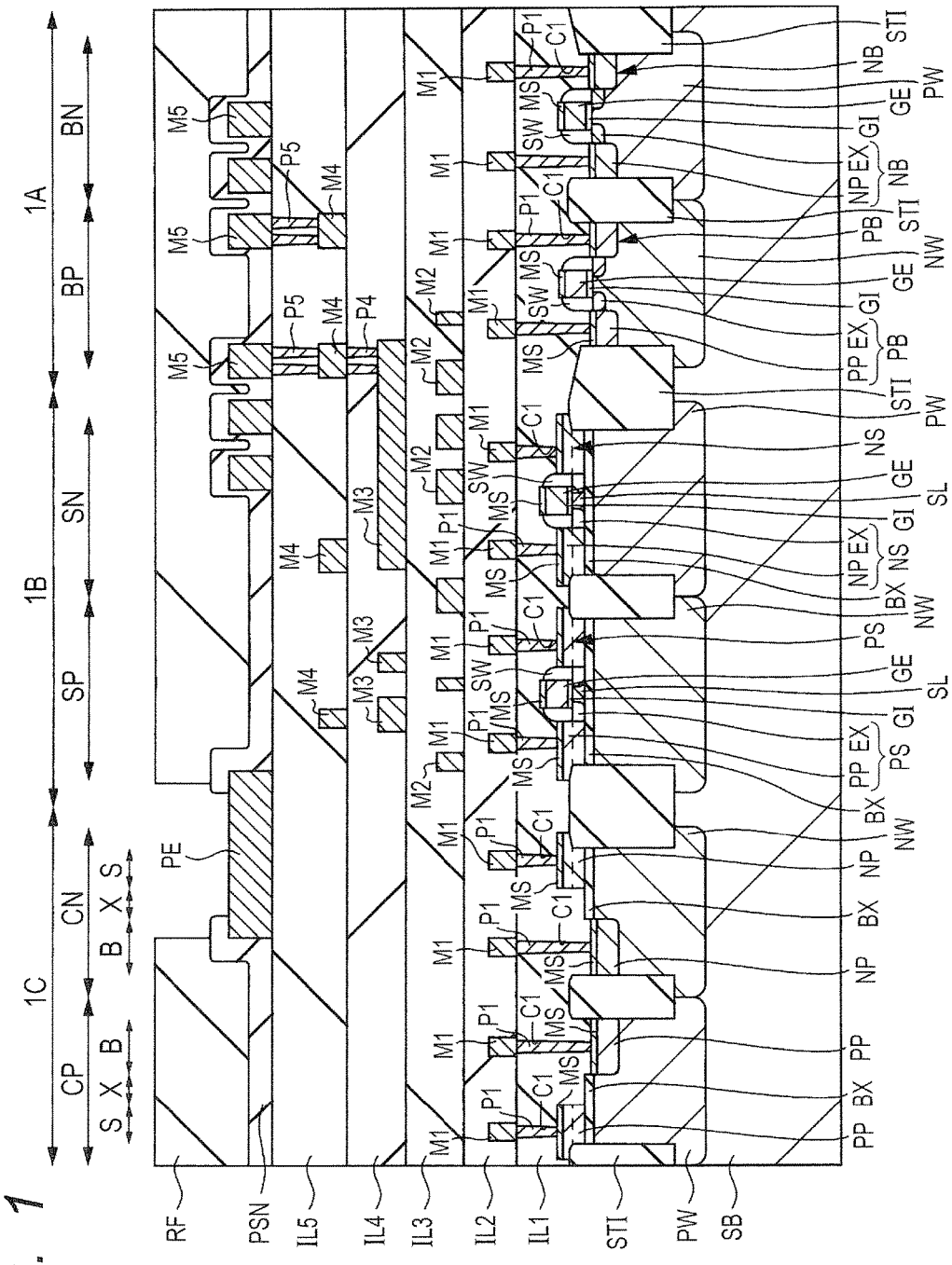
FIG. 1 is a cross section illustrating the configuration of a semiconductor device of a first embodiment.

In the following embodiments, when it is necessary for convenience, an embodiment will be described by being divided to a plurality of sections or examples. Unless otherwise clearly specified, they are not non-related but have relations such as modification, application, detailed description, and supplementary explanation in which one is a part or all of the other. In the following embodiments, in the case of mentioning the number of elements and the like (including the number of pieces, numerical value, quantity, and range), except for the case where it is clearly mentioned, the case where the invention is principally clearly limited to a specific value, and the like, the invention is not limited to the specific value. The number may be larger or smaller than the specific value.

Further, in the following embodiments, obviously, components (including element steps) are not always necessary except for the case where it is clearly mentioned, the case where it is considered that a component is principally clearly necessary, and the like. Similarly, in the following embodiments, when shape, position relation, and the like of components are mentioned, they substantially include shape and the like close or similar to them except for the case where it is clearly mentioned, the case where it is considered that the shape and the like are not principally clearly similar. This is similarly applied also to the number (including the number of pieces, numerical value, quantity, and range).

Hereinafter, embodiments will be described in detail with reference to the drawings. In all of the drawings for explaining the embodiments, the same or related reference numerals are designated to members having the same function and repetitive description will not be given. When a plurality of similar members (parts) exist, in some cases, a sign is added to a generic reference numeral to indicate an individual or specific part. In the following embodiments, unless otherwise necessary, description of the same or similar parts will not be repeated.

In the drawings used in the embodiments, in some cases, hatching is omitted even in a cross section so that the drawing is easily seen. There are also cases that hatching is added even in a plan view so that the drawing is easily seen.

In the cross sections and plan views, the sizes of parts do not correspond to those of actual devices. For easier understanding of the drawings, in some cases, a specific part is displayed relatively large. Also in the case where a cross section and a plan view correspond to each other, for easier understand of the drawings, in some cases, a specific part is displayed relatively large.

First Embodiment

Hereinafter, a semiconductor device of a first embodiment will be described in detail with reference to the drawings.

Description of Structure

Figure 2A:
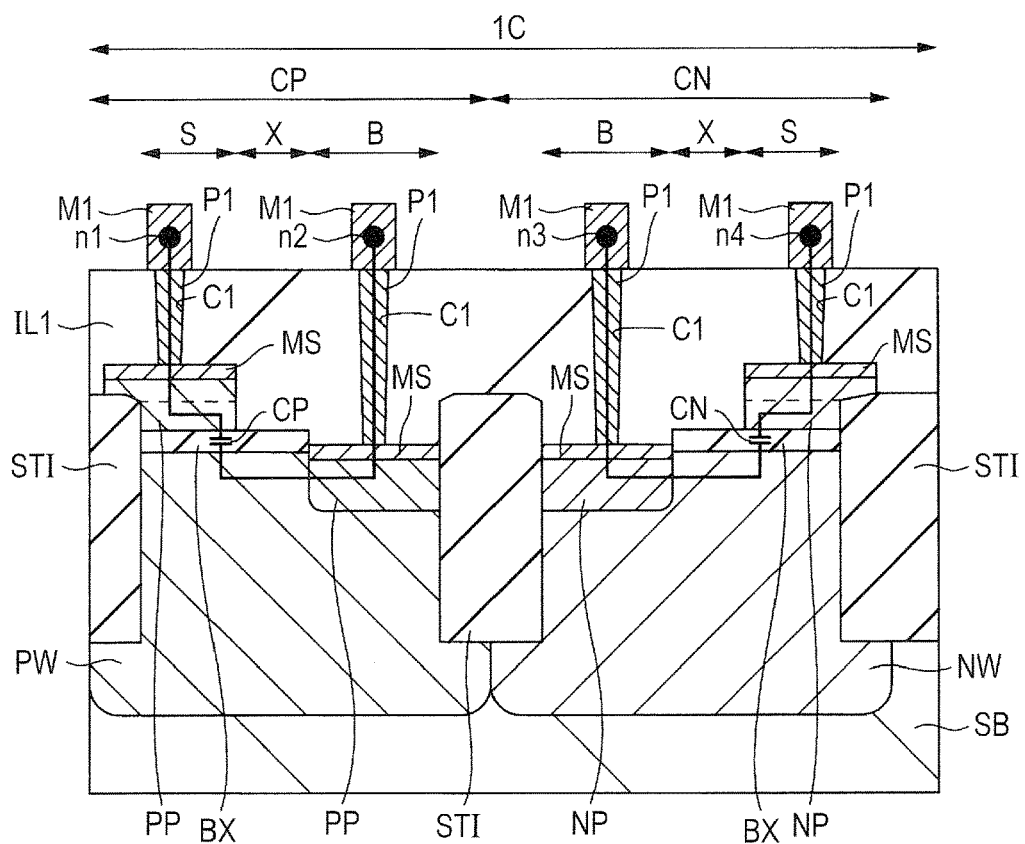
FIGS. 2A and 2B are a cross section and a plan view illustrating the configuration of a capacitive element in the semiconductor device of the first embodiment.
Figure 2B:
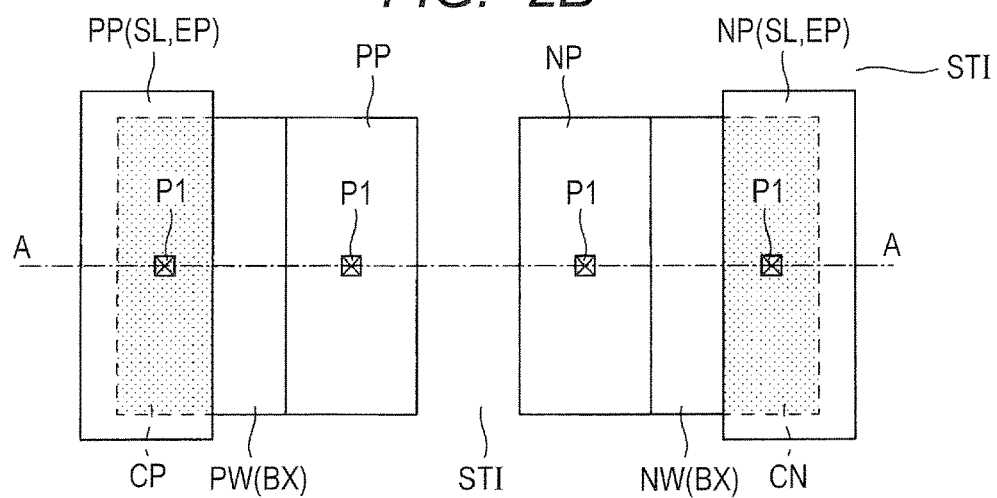

The configuration of a semiconductor device of the embodiment will be described with reference to FIG. 1. FIG. 1 is a cross section illustrating the configuration of the semiconductor device of the first embodiment. FIGS. 2A and 2B are a cross section and a plan view illustrating the configuration of a capacitive element in the semiconductor device of the first embodiment. FIG. 2A is a cross section, and FIG. 2B is a plan view. FIG. 2A corresponds to, for example, the A-A section of FIG. 2B. The semiconductor device of the embodiment is formed by using an SOI substrate and has an SOI transistor, a bulk transistor, and a capacitive element. The transistor is also called an MISFET (Metal Insulator Semiconductor Field Effect Transistor: MIS-type field effect transistor). The SOI substrate has a supporting board SB, an insulating layer BX formed over the supporting board SB, and a semiconductor layer SL formed over the insulating layer BX (refer to FIG. 3).

In the embodiment, a region in which the SOI transistor is formed is set as a "region 1B", a region in which a bulk transistor is formed is set as a "region 1A", and a region in which a capacitive element is set as a "region 1C".

In the region 1B, an SOI transistor of the n-channel type and an SOI transistor of the p-channel type are formed. The region in which the SOI transistor of the n-channel type is formed is set as "region SN" and the region in which the SOI transistor of the p-channel type is foamed is set as "region SP".

In the region 1A, a bulk transistor of the n-channel type and a bulk transistor of the p-channel type are formed. The region in which the bulk transistor of the n-channel type is formed is set as "region BN" and the region in which the bulk transistor of the p-channel type is formed is set as "region BP".

In the region 1C, two capacitive elements are formed. A capacitive element formed over an n-type well NW is called an n-type capacitive element, and a capacitive element formed over a p-type well is called a p-type capacitive element. The region in which the n-type capacitive element is formed is set as "region CN", and the region in which the p-type capacitive element is formed is set as "region CP".

The SOI transistor is formed in a so-called SOI region (the region in which the semiconductor layer SL is formed over the supporting board SB via the insulating layer BX), and the bulk transistor is formed in a so-called bulk region (the region from which the insulating layer BX and the semiconductor layer SL are removed, over the supporting board SB). In the region 1C, the SOI region and the bulk region mixedly exist. A region S in the region 1C is the SOI region, and a region B is a bulk region. A region X in the region 1C is a region in which the insulating layer BX is formed over the supporting board SB and over which the semiconductor layer SL is removed.

The regions 1A, 1B, and 1C are also called active regions and defined by element isolation parts (element isolation regions) STI. In other words, each of the regions 1A, 1B, and 1C is surrounded by the element isolation part STI. In each of the regions, the element isolation part STI is provided. The region is divided into smaller regions.

(1) Configuration of SOI Transistor

The SOI transistor of the n-channel type and the SOI transistor of the p-channel type are formed in the SOI region (the region in which the semiconductor layer SL is formed over the supporting board SB via the insulating layer BX, or the region 1B). The supporting board SB is a semiconductor substrate such as a p-type single-crystal silicon substrate. The insulating layer BX is, for example, a silicon oxide layer. The semiconductor layer SL is, for example, a single-crystal silicon layer. The thickness of the insulating layer BX is about a few nm to about 30 nm, and the thickness of the semiconductor layer SL is, for example, a few nm to about 30 nm.

The SOI transistor of the n-channel type is formed in an active region surrounded (defined) by the element isolation part STI indicated by the region SN. The SOI transistor of the n-channel type has a gate electrode GE formed over the semiconductor layer SL via a gate insulating film GI and a source/drain region NS formed in the semiconductor layer SL on both sides of the gate electrodes GE. On the side wall of the gate electrode GE, a side-wall film (side-wall spacer) SW are formed. The source/drain region NS is a source/drain region of an LDD structure and has a low-concentration impurity region EX of the n type formed in a self-aligned manner with respect to the gate electrode GE and a high-concentration impurity region NP of the n type formed in a self-aligned manner with respect to a composite member (composite pattern, composite formation object) of the gate electrode GE and the side-wall film SW. The impurity concentration of the high-concentration impurity region NP of the n type is higher than that of the low-concentration impurity region EX of the n type.

Figure 11:
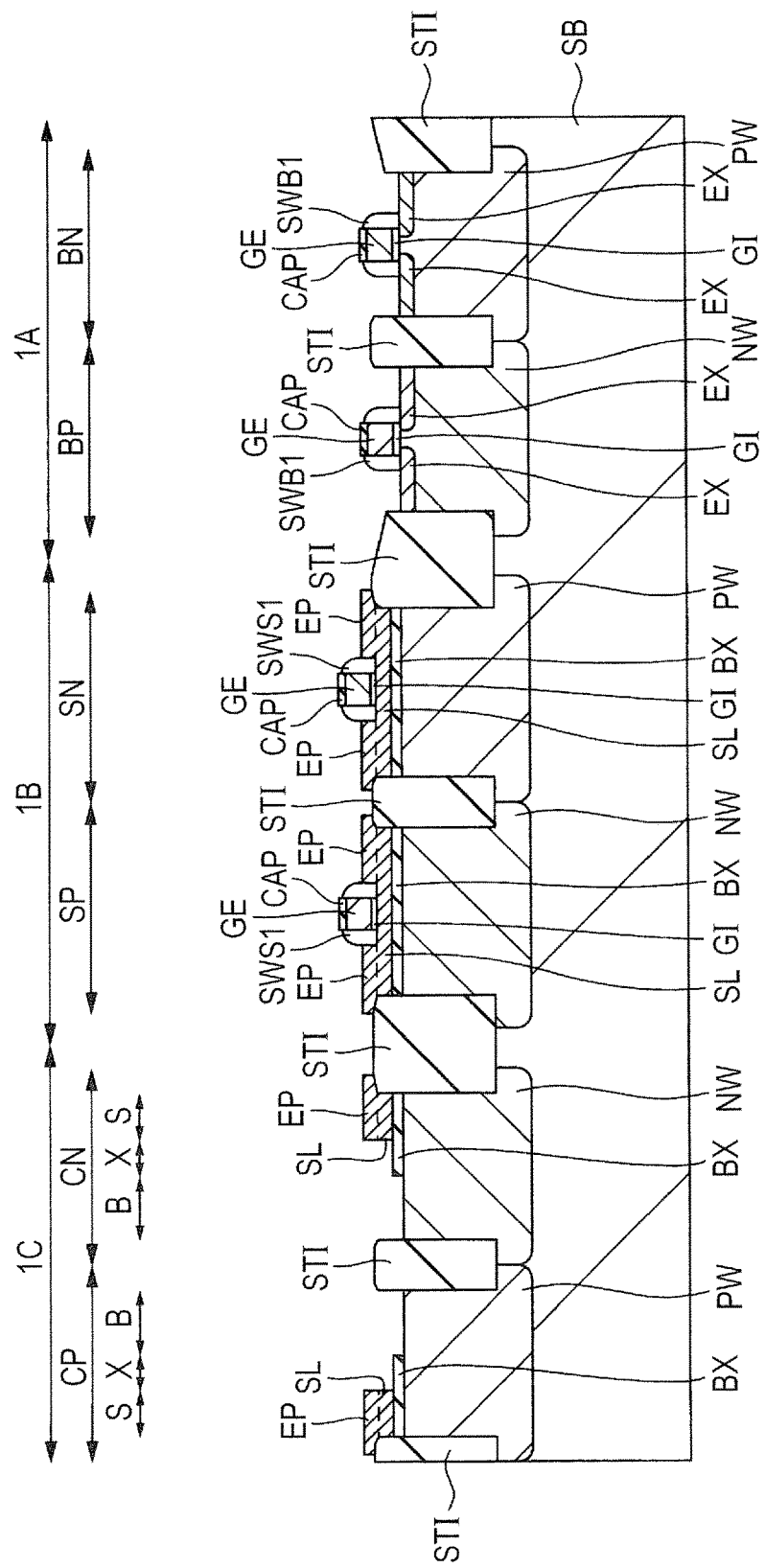
FIG. 11 is a cross section illustrating a process of manufacturing the semiconductor device of the first embodiment.

In the region SN, an epitaxial layer (EP) is arranged over the semiconductor layer SL on both sides of the gate electrode GE (refer to FIG. 11). The epitaxial layer EP also contains high-concentration of n-type impurities (such as phosphor (P) and arsenic (As)). Consequently, the high-concentration impurity region NP of the n type is made by the epitaxial layer EP and the semiconductor layer SL. In other words, the high-concentration impurity region NP of the n type is the impurity region of the n type formed in the stack part of the epitaxial layer EP and the semiconductor layer SL.

Below the insulating layer BX in the SOI transistor of the n-channel type, that is, in the supporting board SB in the region SN, the p-type well PW is formed. The impurity concentration of the p-type well PW is lower than that of the supporting board SB.

The SOI transistor of the p-channel type is formed in an active region surrounded (defined) by the element isolation part STI indicated by the region SP. The SOI transistor of the p-channel type has the gate electrode GE formed over the semiconductor layer SL via the gate insulating film GI and a source/drain region PS formed in the semiconductor layer SL on both sides of the gate electrodes GE. On the side wall of the gate electrode GE, the side-wall film SW is formed. The source/drain region PS is a source/drain region of an LDD structure and has the low-concentration impurity region EX of the p type formed in a self-aligned manner with respect to the gate electrode GE and a high-concentration impurity region PP of the p type formed in a self-aligned manner with respect to a composite member (composite pattern, composite formation object) of the gate electrode GE and the side-wall film SW. The impurity concentration of the high-concentration impurity region PP of the p type is higher than that of the low-concentration impurity region EX of the p type.

In the region SP, the epitaxial layer (EP) is arranged over the semiconductor layer SL on both sides of the gate electrode GE (refer to FIG. 11). The epitaxial layer EP also contains high-concentration of p-type impurities (such as boron (B)). Consequently, the high-concentration impurity region PP of the p type is made by the epitaxial layer EP and the semiconductor layer SL. In other words, the high-concentration impurity region PP of the p type is the impurity region of the p type formed in the stack layer part of the epitaxial layer EP and the semiconductor layer SL.

Below the insulating layer BX in the SOI transistor of the p-channel type, that is, in the supporting board SB in the region SP, the n-type well NW is formed.

The gate electrode GE is made by, for example, a poly-crystal silicon film, and the gate insulating film GI is made by, for example, a silicon oxide film.

In an upper part of the gate electrode GE and an upper part (surface layer part) of the high-concentration impurity regions (NP and PP) for the source and drain, a metal silicide film MS as a reaction layer (compound layer) of metal and semiconductor is formed.

An interlayer insulating film IL1 is formed over the gate electrode GE, the source/drain regions (NS and PS) and the like. Over the source/drain regions (NS and PS), a plug (coupling part) P1 is formed via the metal silicide film MS. The plug P1 is made by a conductive film buried in a connection hole C1 provided in the interlayer insulating film IL1. Over the plug P1, a wire M1 is formed. Although not illustrated in the section of FIG. 1, the plug P1 and the wire M1 above it are formed also over the gate electrode GE, the n-type well NW, and the p-type well PW.

By applying a potential to the well below the insulating layer BX in the SOI transistor via the plug p1, threshold voltage can be adjusted.

(2) Configuration of Bulk Transistor

The bulk transistor of the n-channel type and the bulk transistor of the p-channel type are formed in the bulk regions (the region from which the insulating layer BX and the semiconductor layer SL are removed, the region BN, and the region BN over the supporting board SB).

The bulk transistor of the n channel type is formed in an active region surrounded (defined) by the element isolation part STI indicated by the region BN. The bulk transistor of the n-channel type has the gate electrode GE formed over the p-type well PW in the supporting board SB via the gate insulating film GI and source/drain regions NB formed in the supporting board (p-type well PW) SB on both sides of the gate electrodes GE. On the side wall of the gate electrode GE, the side-wall film SW is formed. The source/drain region NS is a source/drain region of an LDD structure and has the low-concentration impurity region EX of the n type formed in a self-aligned manner with respect to the gate electrode GE and the high-concentration impurity region NP of the n type formed in a self-aligned manner with respect to a composite member of the gate electrode GE and the side-wall film SW. The impurity concentration of the high-concentration impurity region NP of the n type is higher than that of the low-concentration impurity region EX of the n type.

The bulk transistor of the p channel type is formed in an active region surrounded (defined) by the element isolation part STI indicated by the region BP. The bulk transistor of the p-channel type has the gate electrode GE formed over the n-type well NW in the supporting board SB via the gate insulating film GI and source/drain regions PB formed in the supporting board (n-type well NW) SB on both sides of the gate electrodes GE. On the side wall of the gate electrode GE, the side-wall film SW is formed. The source/drain region PB is a source/drain region of an LDD structure and has the low-concentration impurity region EX of the p type formed in a self-aligned manner with respect to the gate electrode GE and the high-concentration impurity region PP of the p type formed in a self-aligned manner with respect to a composite member of the gate electrode GE and the side-wall film SW. The impurity concentration of the high-concentration impurity region PP of the p type is higher than that of the low-concentration impurity region EX of the p type.

The gate electrode GE is made by, for example, a polycrystal silicon film, and the gate insulating film GI is made by, for example, a silicon oxide film.

In an upper part of the gate electrode GE and an upper part (surface layer part) of the high-concentration impurity regions (NP and PP) for the source and drain, the metal silicide film MS as a reaction layer (compound layer) of metal and semiconductor is formed.

The interlayer insulating film IL1 is formed over the gate electrode GE, the source/drain regions (NS and PS) and the like. Over the source/drain regions (NB and PB), the plug P1 is formed via the metal silicide film MS. The plug P1 is made by a conductive film buried in the coupling hole C1 provided in the interlayer insulating film IL1. Over the plug P1, the wire M1 is formed. Although not illustrated in the section of FIG. 1, the plug P1 and the wire M1 above it are formed also over the gate electrode GE.

(3) Configuration of Capacitive Element

Two capacitive elements (an n-type capacitive element and a p-type capacitive element) are formed in the region 1C. As described above, in the region 1C, the SOI region and the bulk region mixedly exist. The region S in the region 1C is an SOI region, and the region B is a bulk region. The region X in the region 1C is a region in which the insulating layer BX is formed over the supporting board SB but the semiconductor layer SL over the insulating layer BX is removed.

The capacitive element (n-type capacitive element) is formed in the active region surrounded (defined) by the element isolation part STI indicated by the region CN. The capacitive element (n-type capacitive element) has the supporting board SB, the insulating layer BX formed over the supporting board SB, and the semiconductor layer SL foamed over the insulating layer BX. In the supporting board SB in the region CN, the n-type well NW is formed.

In the region CN, the epitaxial layer (EP) is arranged over the semiconductor layer SL (refer to FIG. 11). To the layer stack part, n-type impurities (such as phosphor P or arsenic (As)) are introduced at high concentration, and the high-concentration impurity region NP of the n type is obtained. In the region CN, an opening is provided in the insulating layer BX. In the supporting board (n-type well NW) SB exposed from the opening, the high-concentration impurity region NP of the n type is formed.

That is, the capacitive element (n-type capacitive element) has, in the region 1C (CN), a top electrode made by the layer stack part (the high-concentration impurity region NP of the n type) of the semiconductor layer SL and the epitaxial layer (EP), a capacitance insulating film made by the insulating layer BX, and a bottom electrode made by the supporting board (n-type well NW) SB. The high-concentration impurity region NP of the n type in the supporting board (n-type well NW) SB becomes a lead part of the bottom electrode. In the layer stack part (the high-concentration impurity region NP of the n type) of the semiconductor layer SL and the epitaxial layer (EP) and the upper part (surface layer part) of the high-concentration impurity region NP of the n type in the supporting board (n-type well NW) SB, the metal silicide layer MS is formed.

In the region 1C (CN), the interlayer insulating film 1L1 is formed over the top electrode (the layer stack part (the high-concentration impurity region NP of the n type) of the semiconductor layer SL and the epitaxial layer (EP)), the capacitance insulating film (the insulating layer BX), and the lead part (the high-concentration impurity region NP of the n type in the supporting board (n-type well NW)) SB of the bottom electrode. The plugs P1 are formed via the metal silicide film MS over the top electrode (the layer stack part (the high-concentration impurity region NP of the n type) of the semiconductor layer SL and the epitaxial layer (EP)) and the lead part (the high-concentration impurity region NP of the n type in the supporting board (n-type well NW) SB) of the bottom electrode. The plug P1 is made by the conductive film buried in the coupling hole C1 provided in the interlayer insulating film IL1. As illustrated in FIG. 2A, the n-type capacitive element (CN) is coupled between the wires M1 (between the nodes n3 and n4).

The capacitive element (p-type capacitive element) is formed in the active region surrounded (defined) by the element isolation part STI indicated by the region CP. The capacitive element (p-type capacitive element) has the supporting board SB, the insulating layer BX formed over the supporting board SB, and the semiconductor layer SL foamed over the insulating layer BX. In the supporting board SB in the region CP, the p-type well PW is formed.

(EP) is arranged (refer to FIG. 11). To the layer stack part, p-type impurities (such as boron B) are introduced at high concentration, and the high-concentration impurity region PP of the p type is obtained. In the region CP, an opening is provided in the insulating layer BX. In the supporting board (p-type well PW) SB exposed from the opening, the high-concentration impurity region PP of the p type is formed.

That is, the capacitive element (p-type capacitive element) has, in the region 1C (CP), a top electrode made by the layer stack part (the high-concentration impurity region PP of the p type) of the semiconductor layer SL and the epitaxial layer (EP), a capacitance insulating film made by the insulating layer BX, and a bottom electrode made by the supporting board (p-type well PW) SB. The high-concentration impurity region PP of the p type in the supporting board (p-type well PW) SB becomes a lead part of the bottom electrode. In the layer stack part (the high-concentration impurity region PP of the p type) of the semiconductor layer SL and the epitaxial layer (EP) and the upper part (surface layer part) of the high-concentration impurity region PP of the p type in the supporting board (p-type well PW) SB, the metal silicide layer MS is formed.

In the region 1C (CN), the interlayer insulating film 1L1 is formed over the top electrode (the layer stack part (the high-concentration impurity region PP of the p type) of the semiconductor layer SL and the epitaxial layer (EP)), the capacitance insulating film (the insulating layer BX), and the lead part (the high-concentration impurity region PP of the p type in the supporting board (p-type well PW)) SB of the bottom electrode. The plugs P1 are formed via the metal silicide film MS over the top electrode (the layer stack part (the high-concentration impurity region PP of the p type) of the semiconductor layer SL and the epitaxial layer (EP)) and the lead part (the high-concentration impurity region PP of the p type in the supporting board (p-type well PW) SB) of the bottom electrode. The plug P1 is made by the conductive film buried in the coupling hole C1 provided in the interlayer insulating film IL1. As illustrated in FIG. 2A, the p-type capacitive element (CP) is coupled between the wires M1 (between the nodes n1 and n2).

As described above, by using the insulating layer BX as a capacitance insulating film, the capacitance per unit area can be increased. Particularly, the SOI transistor is formed in the main surface of so-called SOTB (Silicon On Thin Buried oxide) of the semiconductor layer SL over the insulating layer BX as a thin film. In the case of using the insulating layer BX of the thin film, by applying voltage to the well arranged on the rear side of the insulating layer BX, the threshold voltage can be adjusted. The thickness of the insulating layer BX of the thin film is 50 nm or less and, more preferably, a few nm to 30 nm. Consequently, the insulating layer BX sufficiently functions as a capacitance insulating film and can be used as a capacitive element of high capacitance.

The capacitance of the capacitive element can be adjusted by, for example, an overlap region of the top and bottom electrodes, that is, an overlap region of the stack layer part of the semiconductor layer SL and the epitaxial layer (EP) and the supporting board (the well PW or NW). The overlap region is indicated by dot-hatching (gray) in FIG. 2B. For example, when the thickness of the insulating layer BX is set to about 20 nm, to assure the capacitance of 10 pF, it is sufficient to set the overlap region to about 5647 μm². To assure the capacitance of 5 pF, it is sufficient to set the overlap region to about 2823 μm². In such a manner, a capacitive element (fixed capacitance) of high capacitance can be realized using a small area.

It is also possible to provide voltage dependency by adjusting potentials applied to the top and bottom electrodes.

By using the semiconductor layer SL as the top electrode, the manufacture process of the SOI transistor can be shared. By using the supporting board (the n-type well NW or p-type well PW) SB as the bottom electrode, the manufacture process of the SOI transistor can be shared. Further, by using the high-concentration impurity region NP of the n type or the high-concentration impurity region PP of the p type in the supporting board SB exposed from the opening in the insulating layer BX as the lead part of the bottom electrode, the manufacture process of the bulk transistor can be shared. The sharing of the manufacture processes will become the column of "description of manufacturing method" which will be described later.

(4) Configuration Over Wire M1

Over the wire M1, an interlayer insulating film IL2, a wire M2, and the like are formed. Although not illustrated in the section of FIG. 1, plugs are formed also in the interlayer insulating film IL2. Similarly, over the wire M2, an interlayer insulating film IL3, a wire M3, and the like are formed. Over the wire M3, an interlayer insulating film IL4, a wire M4, and the like are formed. Over the wire M4, an interlayer insulating film IL5, a wire M5, and the like are formed. Over the wire (highest-layer wire) M5, a stack-layer film of an insulating film PSN and a protection film RF is formed. A part of the wire M5 is exposed from an opening in the stack-layer film. The exposed part of the wire M5 becomes a pad electrode (external coupling terminal) PE.

Description of Manufacturing Method

Subsequently, a process of manufacturing the semiconductor device of the embodiment will be described with reference to FIGS. 3 to 17, and the configuration of the semiconductor device of the embodiment will be more clarified. FIGS. 3 to 17 are cross sections illustrating a process of manufacturing the semiconductor device of the embodiment.

Figure 3:
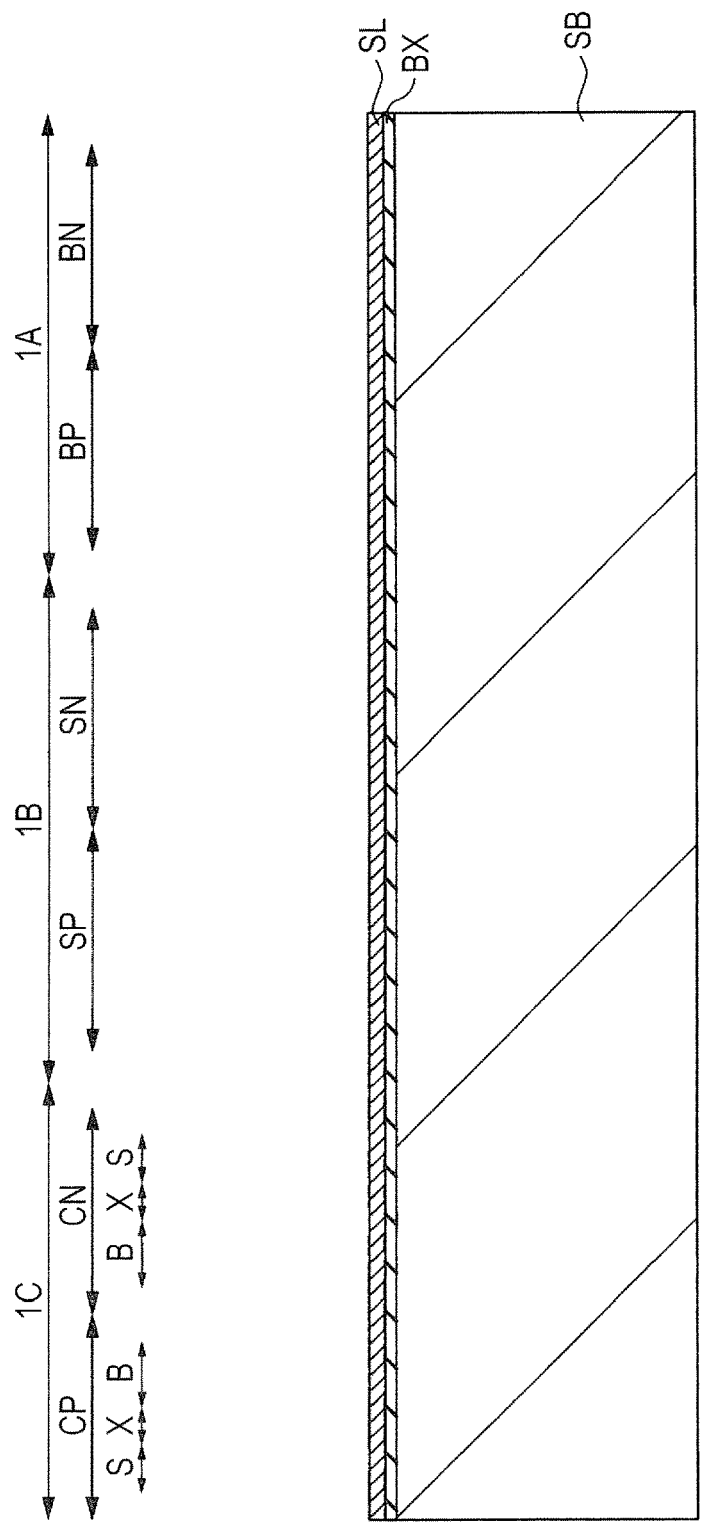
FIG. 3 is a cross section illustrating a process of manufacturing the semiconductor device of the first embodiment.

First, as illustrated in FIG. 3, an SOI substrate (semiconductor wafer) is prepared as a substrate. The SOI substrate has the supporting board SB, the insulating layer BX formed over the supporting board SB, and the semiconductor layer SL formed over the insulating layer BX.

The supporting board SB is a semiconductor substrate made of, for example, p-type single-crystal silicon (Si), and the insulating layer BX is, for example, a layer made of silicon oxide. The semiconductor layer SL is, for example, a layer made of single-crystal silicon having resistance of about 1 to 10 Ωcm. The thickness of the insulating layer BX is about a few nm to about 30 nm. The thickness of the semiconductor layer SL is, for example, a few nm to about 30 nm.

Figure 4:
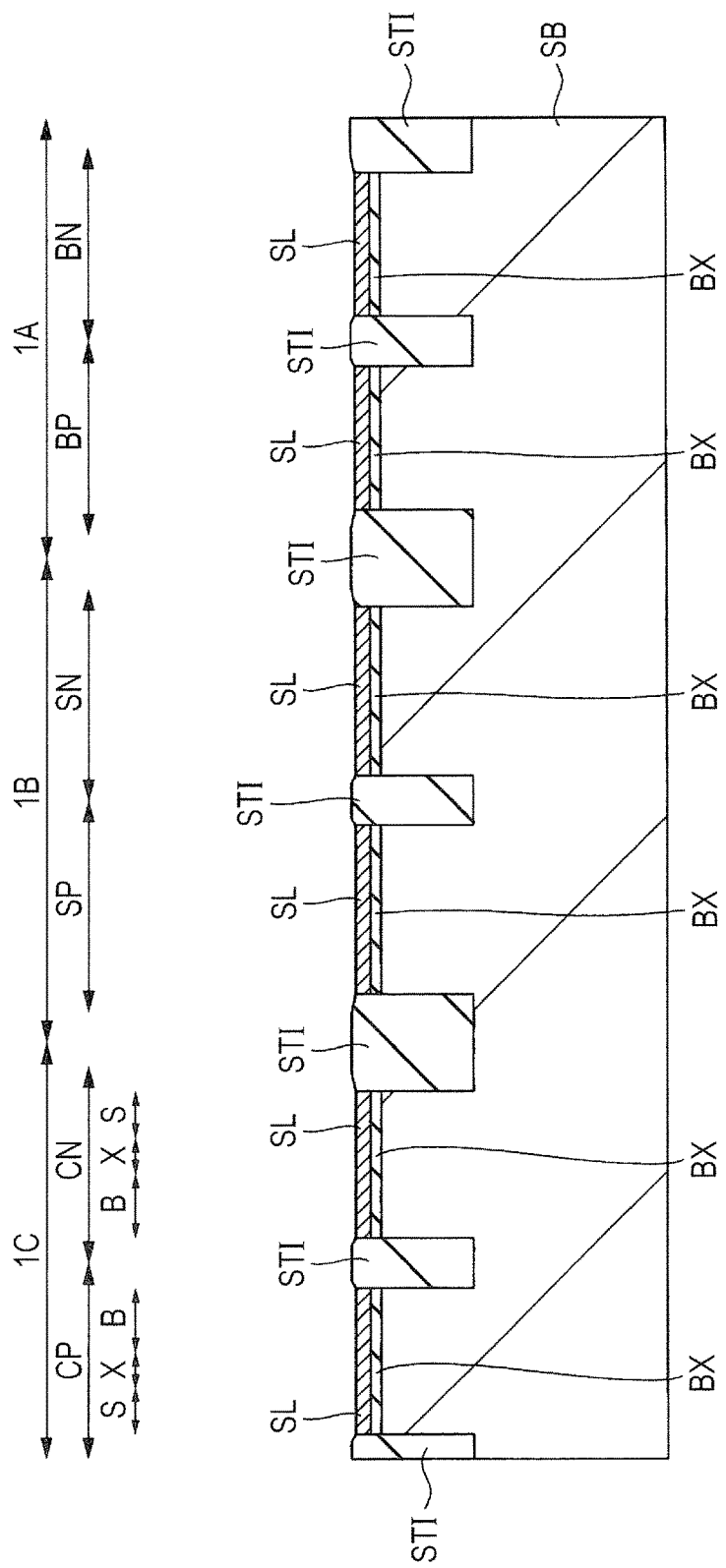
FIG. 4 is a cross section illustrating a process of manufacturing the semiconductor device of the first embodiment.

As illustrated in FIG. 4, the element isolation part STI is formed. For example, a hard mask (not illustrated) made by a silicon nitride film or the like is formed in a region left as an active region, and dry etching is performed by using the hard mask as a mask, thereby eliminating a part of the semiconductor layer SL, the insulating layer BX, and the supporting board SB to form an element isolation trench. Etching of a film in a lower layer using a film of a desired shape as a mask is called patterning. The element isolation trench penetrates the semiconductor layer SL and the insulating layer BX and reaches some midpoint in the supporting board SB. In other words, the bottom of the element isolation trench is positioned deeper than the bottom face (bottom part) of the insulating layer BX.

Subsequently, over the element isolation trench and the hard mask, an insulating film is formed with a film thickness to a degree that the element isolation trench is buried. For example, a silicon oxide film is deposited as an insulating film by using the CVD (Chemical Vapor Deposition) method or the like.

After that, the insulating film which is not in the element isolation trench is removed by using the CMP (Chemical Mechanical Polishing), etch back method, or the like until the hard mask is exposed. By the operation, the element isolation part STI in which the insulating film is buried in the element isolation trench can be formed. The element isolation part STI is formed to prevent interferences among elements formed in the regions 1A, 1B, and 1C. Subsequently, the hard mask is removed.

Figure 5:
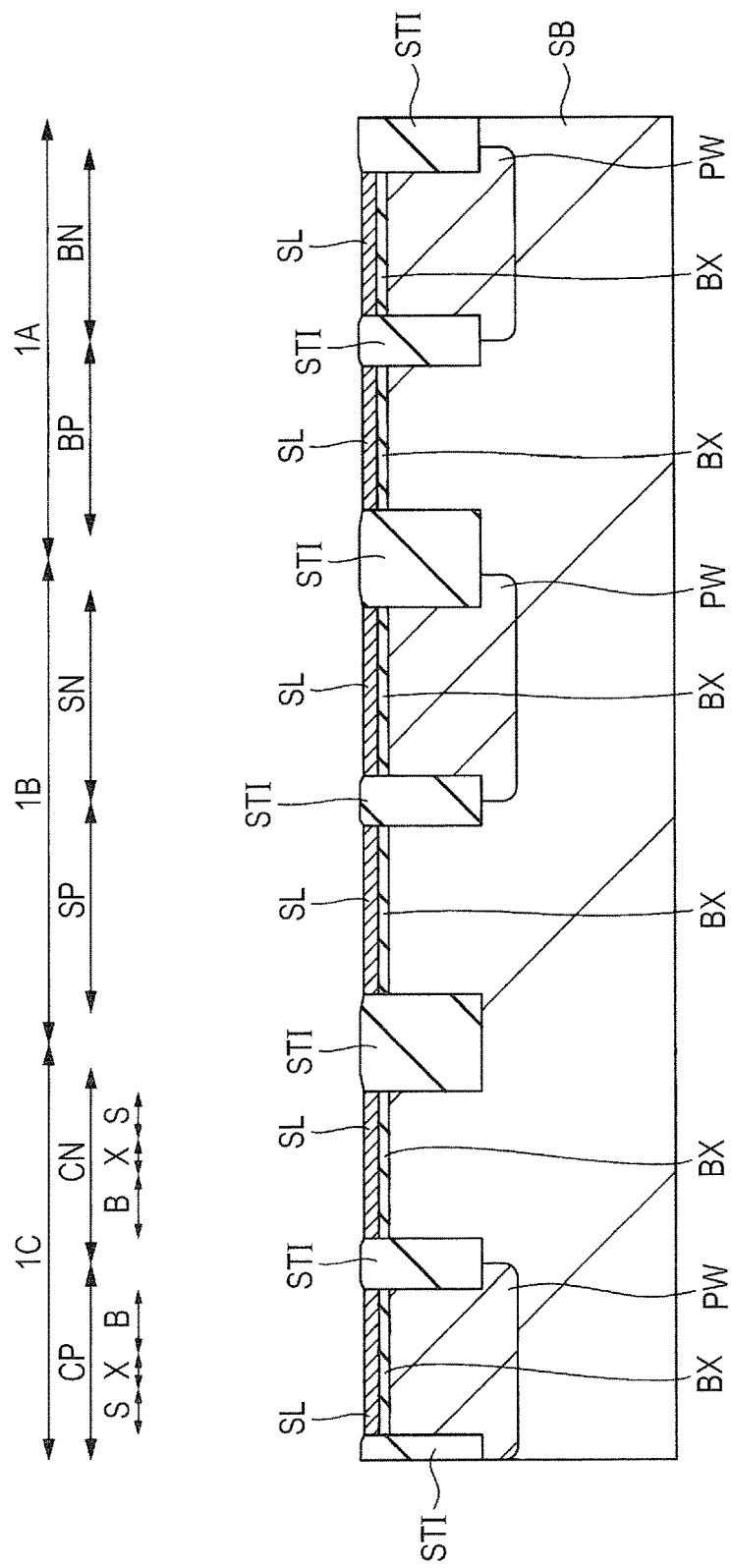
FIG. 5 is a cross section illustrating a process of manufacturing the semiconductor device of the first embodiment.

As illustrated in FIG. 5, the p-type wells PW in the regions are formed. Using a photoresist film (not illustrated) in which a formation region of the p-type well PW is opened as a mask, the impurity of the p type is ion-implanted into the supporting board SB below the insulating layer BX. Subsequently, the photoresist film is removed by asking process of the like. The p-type wells PW in the regions may be formed one by one while varying the ion implantation condition.

Figure 6:
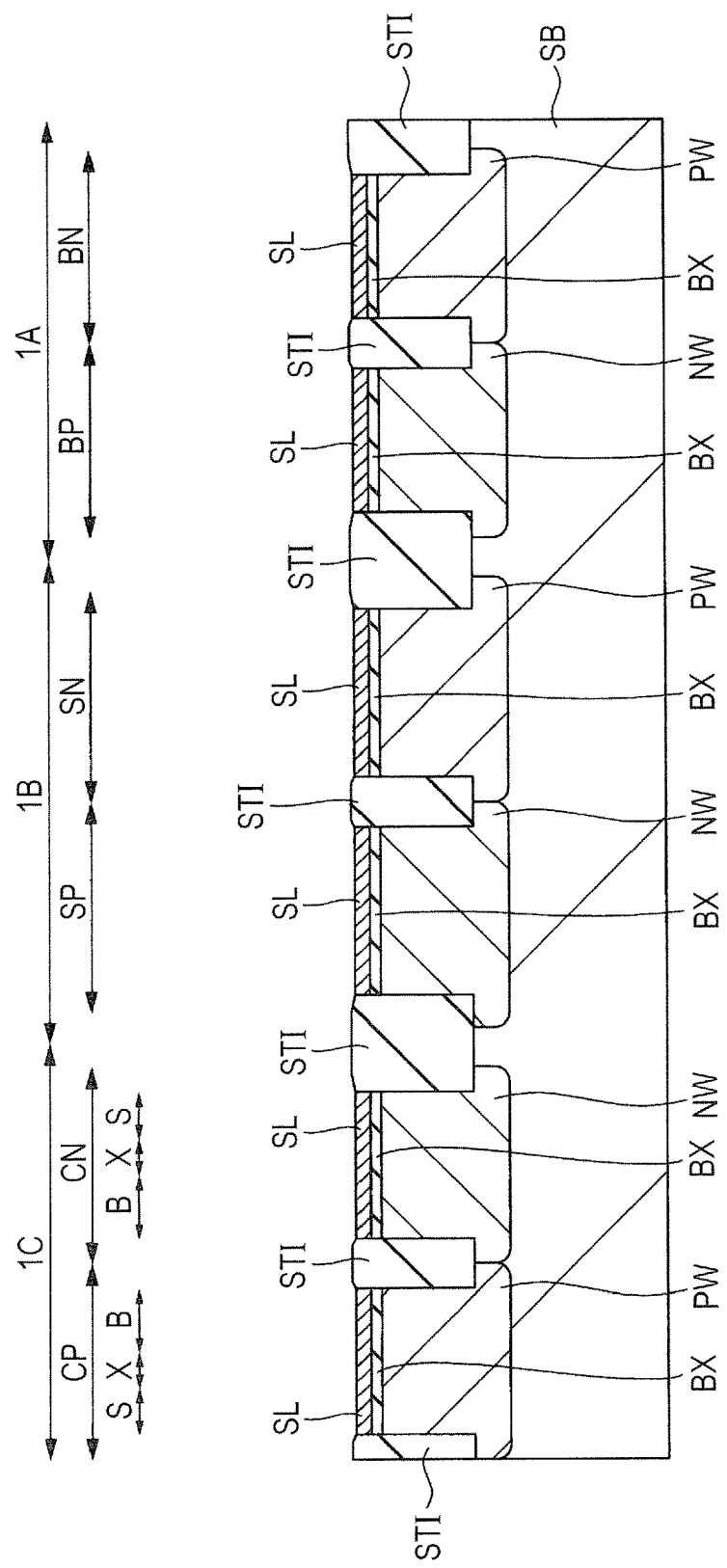
FIG. 6 is a cross section illustrating a process of manufacturing the semiconductor device of the first embodiment.

As illustrated in FIG. 6, the n-type wells NW are formed. Using a photoresist film (not illustrated) in which a formation region of the n-type well NW in each region is opened as a mask, the impurity of the p type is ion-implanted into the supporting board SB below the insulating layer BX. Subsequently, the photoresist film is removed by ashing process of the like. The p-type wells PW in the regions may be formed one by one while varying the ion implantation condition.

Figure 7:
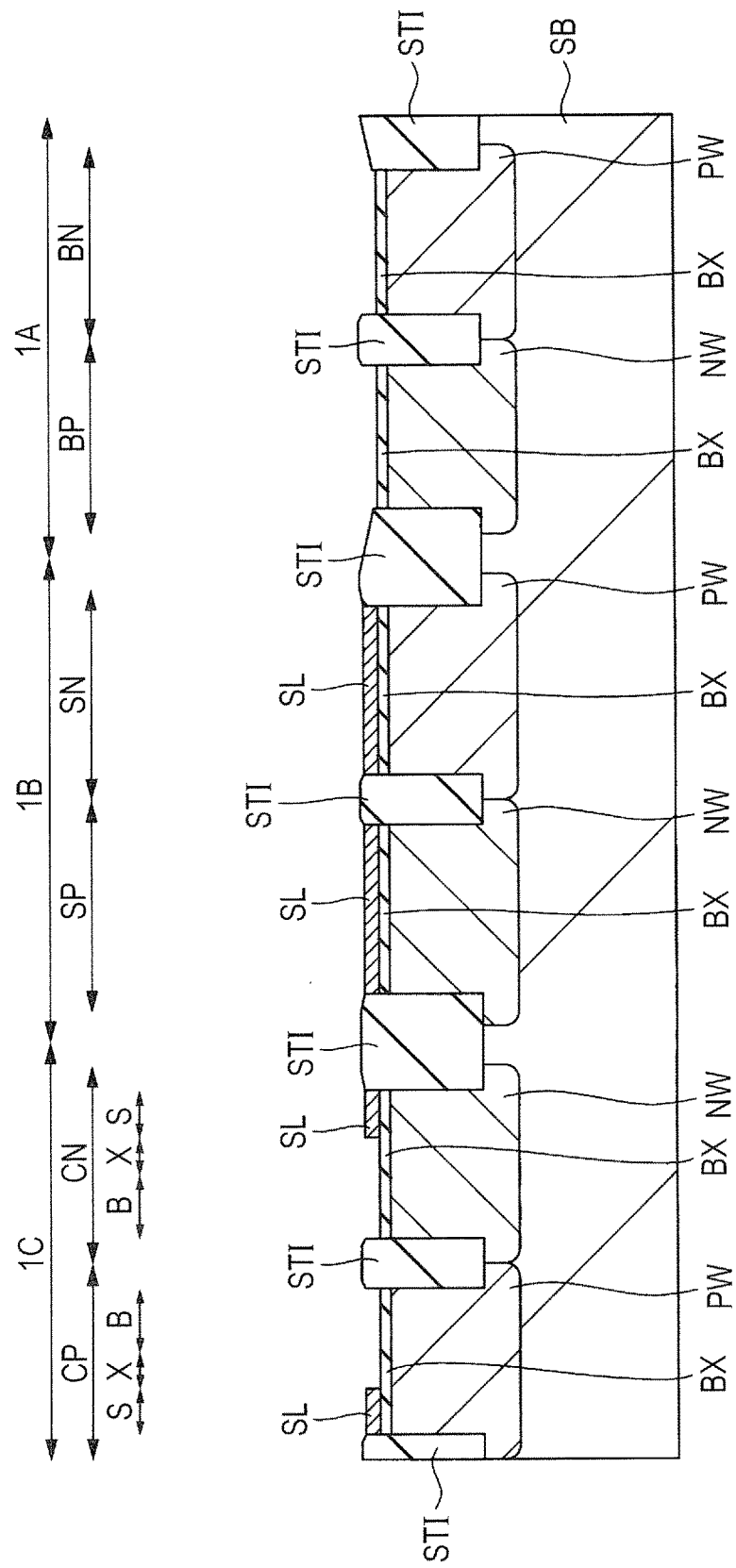
FIG. 7 is a cross section illustrating a process of manufacturing the semiconductor device of the first embodiment.

As illustrated in FIG. 7, the semiconductor layer SL in the region 1A and parts (regions X and B) in the region 1C is removed. For example, using a photoresist film (not illustrated) in which the region of removing the semiconductor layer SL is opened as a mask, the semiconductor layer SL in parts in the regions 1A and 1C is etched. Subsequently, the photoresist film is removed by ashing process or the like.

Figure 8:
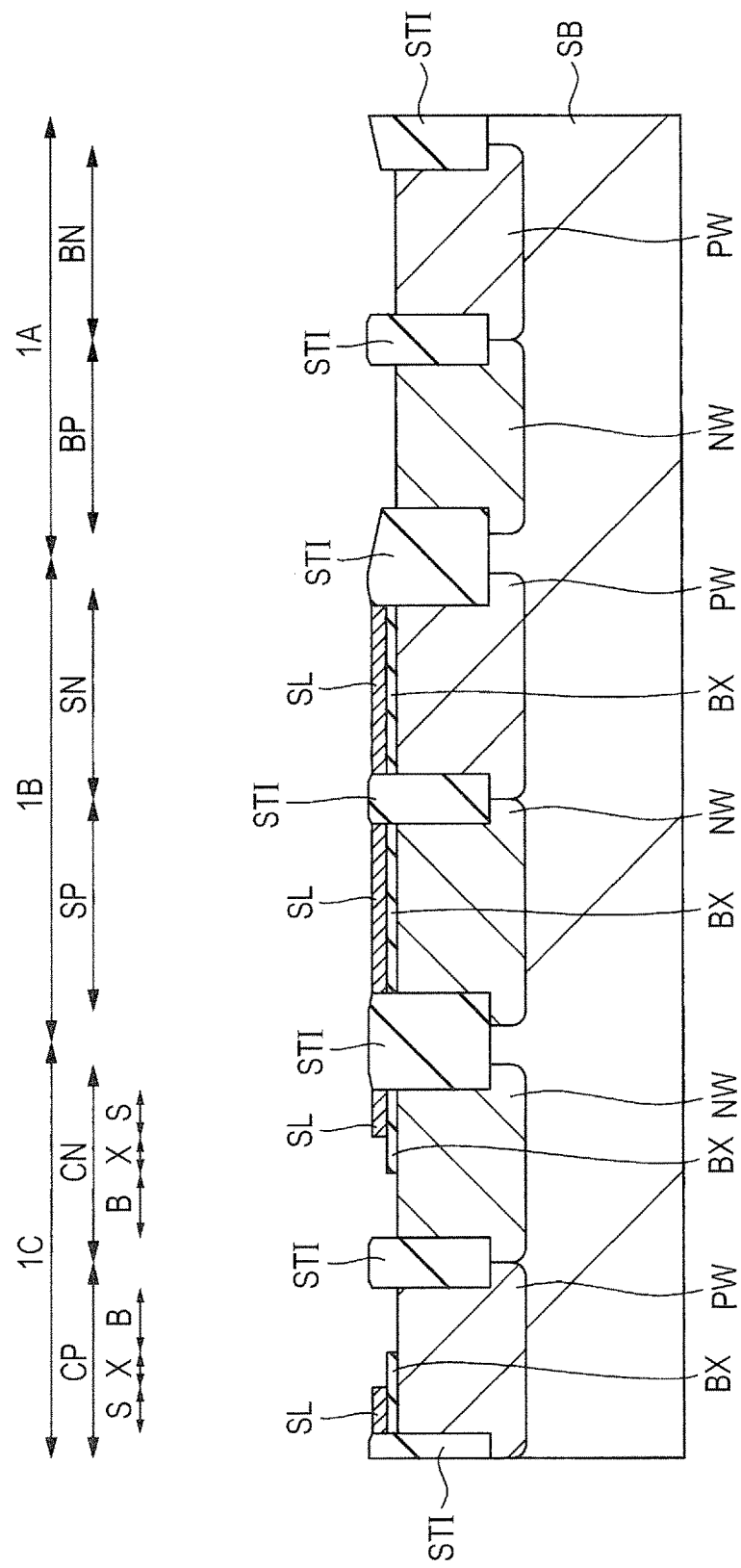
FIG. 8 is a cross section illustrating a process of manufacturing the semiconductor device of the first embodiment.

As illustrated in FIG. 8, the insulating layer BX in the region 1A and a part (region B) in the region 1C is removed. For example, using the photoresist film (not illustrated) in which the region of removing the insulating layer BX is open as a mask, the insulating layer BX in the region 1A and a part (region B) in the region 1C is etched. After that, the photoresist film is removed by ashing process or the like.

Figure 9:
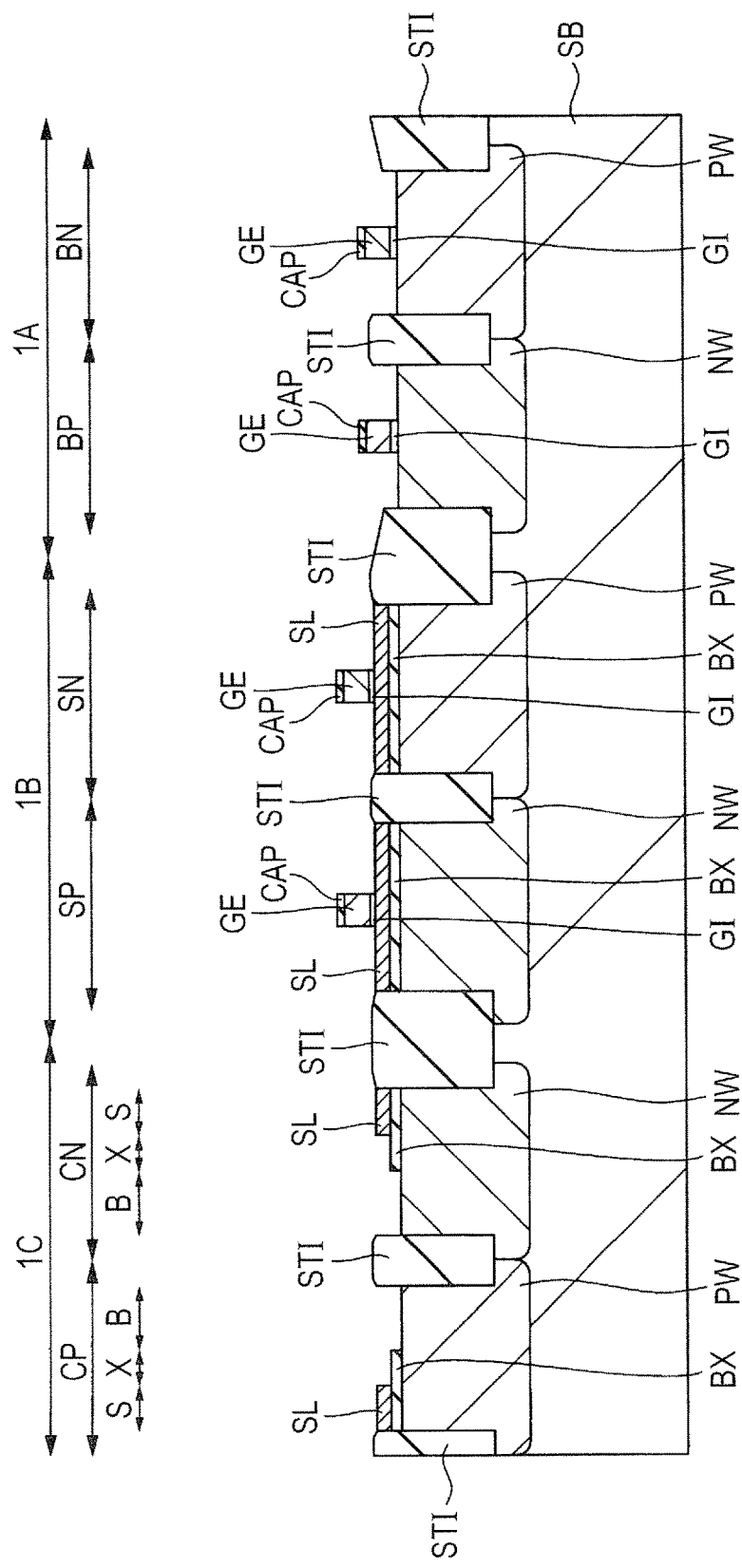
FIG. 9 is a cross section illustrating a process of manufacturing the semiconductor device of the first embodiment.

As illustrated in FIG. 9, the gate insulating film GI and the gate electrode GE are formed in the regions. For example, by thermally oxidizing the top face of the semiconductor layer SL and the supporting board SB, the gate insulating film GI made by the silicon oxide film is formed. After that, over the gate insulating film GI, a conductive film which becomes a gate electrode is formed. For example, as a conductive film, a polycrystal silicon film is formed by using the CVD method or the like. Subsequently, over the conductive film, a cap insulating film CAP is formed. For example, over the polycrystal silicon film, a silicon nitride film is formed as the cap insulating film CAP by using the CVD method or the like. By patterning the polycrystal silicon film and the cap insulating film CAP, the gate electrodes GE are formed in the regions. At this time, the gate insulating film GI on both sides of the gate electrode GE may be removed.

As illustrated in FIGS. 10 to 15, the source/drain regions in the SOI transistor and the bulk transistor, the high-concentration impurity region NP of the n type or the high-concentration impurity region PP of the p type in the layer stack part of the semiconductor layer SL and the epitaxial layer EP, the high-concentration impurity region NP in the n-type well NW, and the high-concentration impurity region PP of the p type in the p-type well PW are formed.

Figure 10:
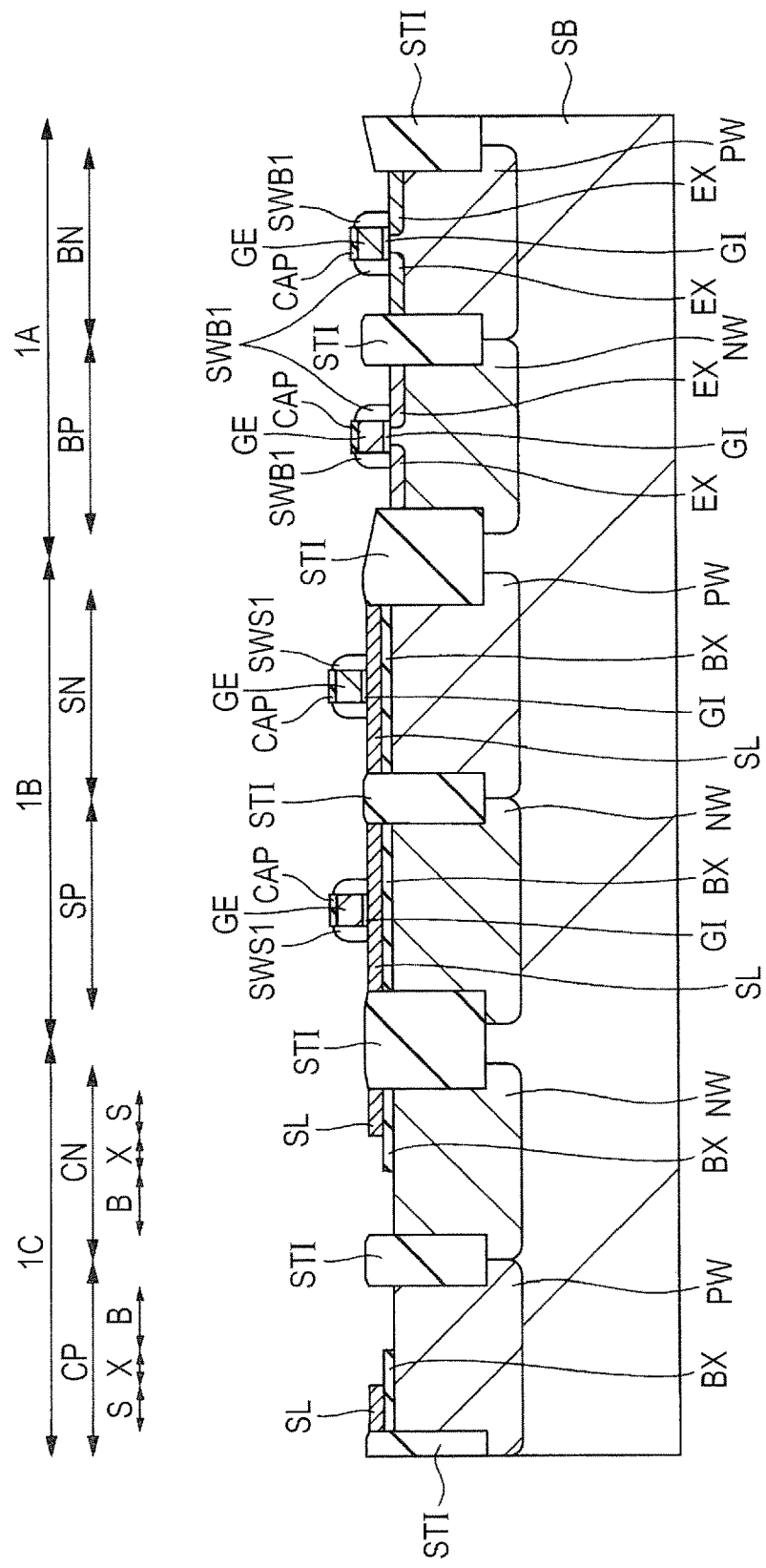
FIG. 10 is a cross section illustrating a process of manufacturing the semiconductor device of the first embodiment.

As illustrated in FIG. 10, in the region 1A, the low-concentration impurity region EX of the n type and the low-concentration impurity region EX of the p type are formed in the supporting board (n-type well NW and p-type well PW) SB on both sides of the gate electrode GE. For example, using a photoresist film (not illustrated) having an opening in the region BN in the region 1A as a mask, n-type impurities are introduced to both sides of the gate electrode GE by the ion implantation method. The photoresist film (not illustrated) is removed by ashing process or the like. Subsequently, using a photoresist film (not illustrated) having an opening in the region BP in the region 1A as a mask, p-type impurities are introduced to the n-type wells NW on both sides of the gate electrode GE by the ion implantation method. The photoresist film (not illustrated) is removed by ashing process or the like.

On the side walls of the gate electrode GE, side-wall films (SWS1 and SWB1) made by an insulating film are formed. For example, the insulating film is formed in the regions 1A and 1B and is subjected to anisotropic etching, thereby making the side-wall films (SWS1 and SWB1) remain. The side-wall film may remain on the side walls of the semiconductor layer SL in the region 1C.

As illustrated in FIG. 11, the region 1B and the regions B in the region 1C are covered with a mask film to form the epitaxial layer EP over the semiconductor layer SL in the regions 1B and 1C. For example, by epitaxial growth using Dichlorosilanes ($SiH_2Cl_2$) and hydrogen chloride (HCl) gas, a silicon layer is formed as the epitaxial layer EP over the semiconductor layer SL.

Figure 12:
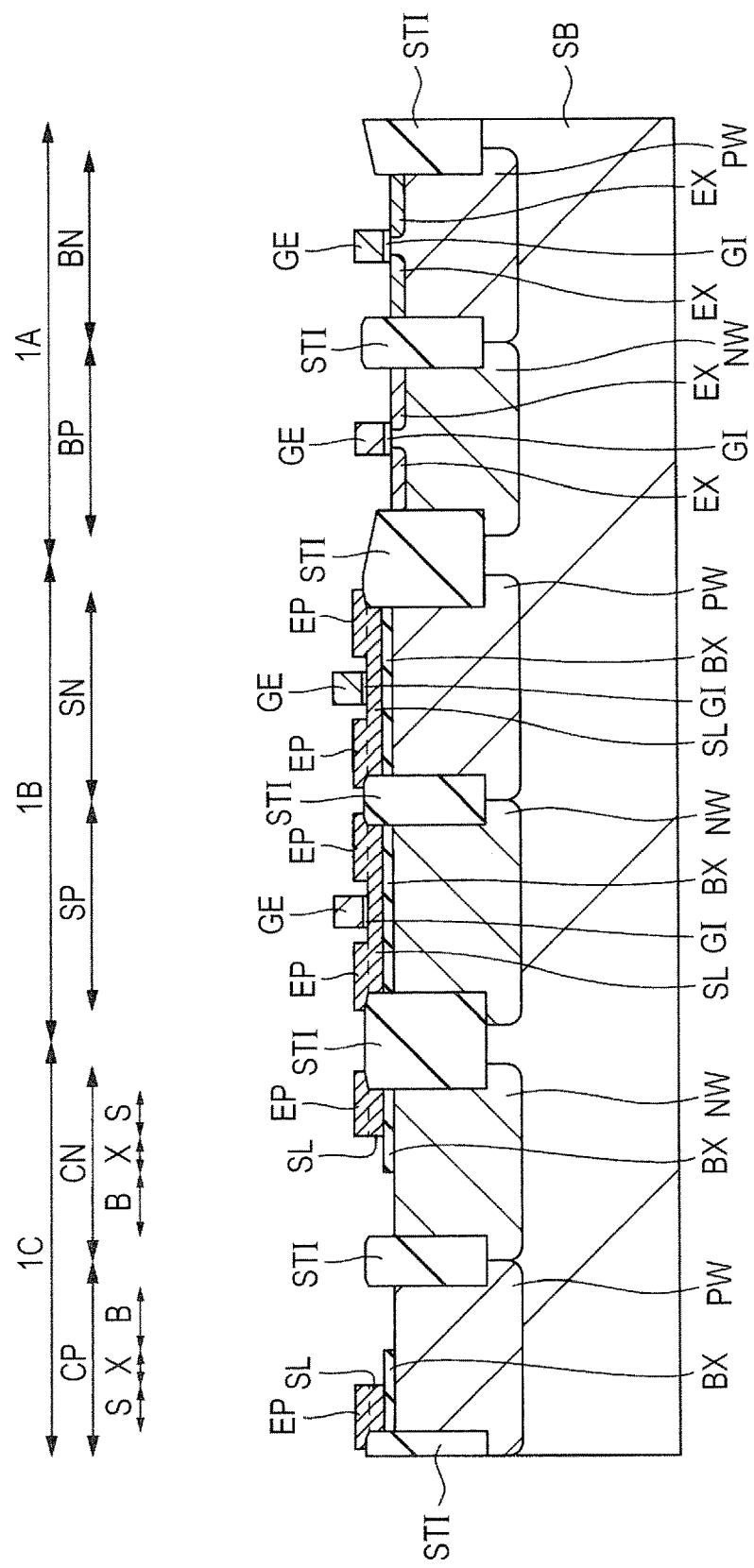
FIG. 12 is a cross section illustrating a process of manufacturing the semiconductor device of the first embodiment.

After that, as illustrated in FIG. 12, the side-wall films (SWS1 and SWB1) in the side walls of the gate electrodes GE in the regions are removed and, further, the cap insulating film CAP is removed.

Figure 13:
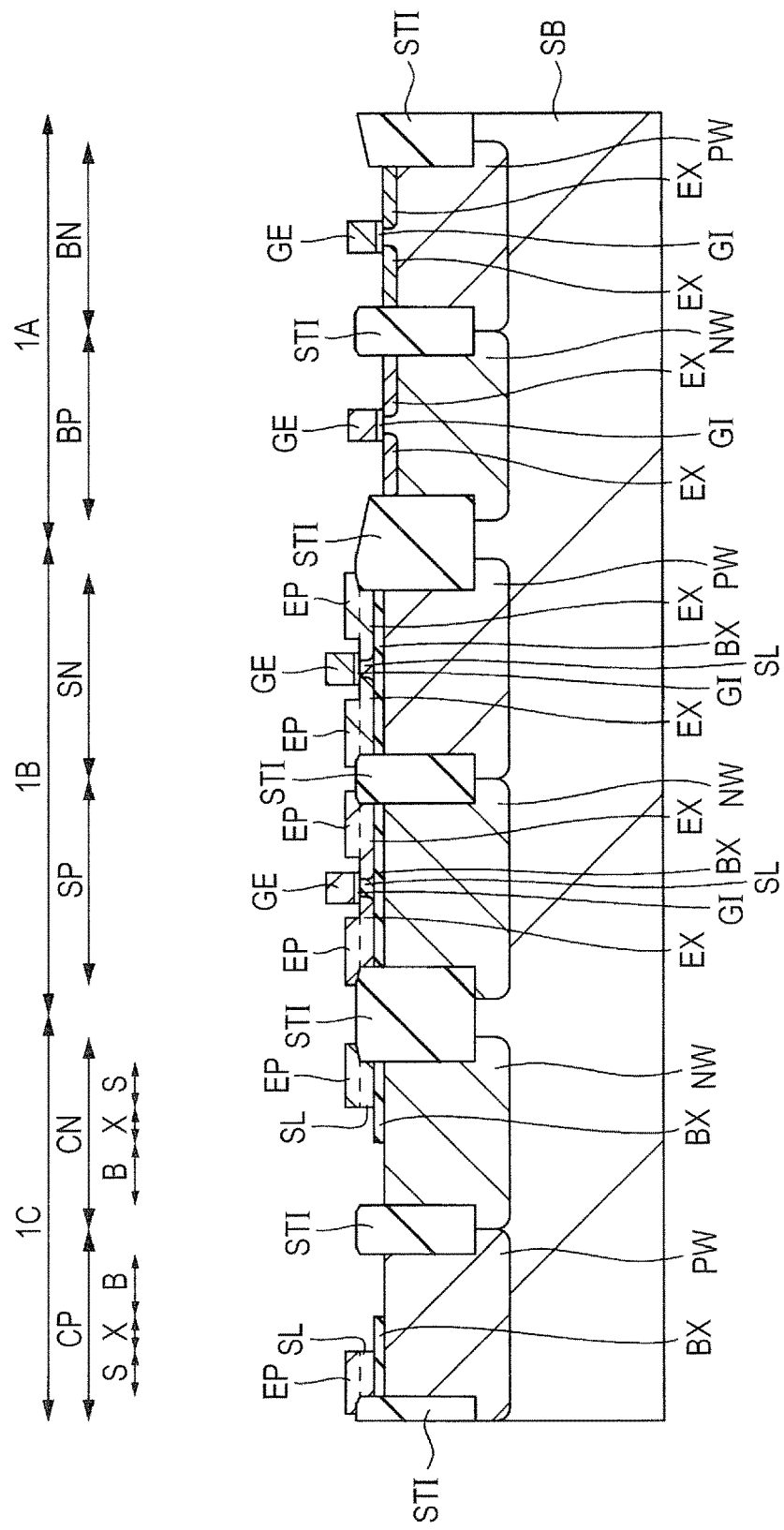
FIG. 13 is a cross section illustrating a process of manufacturing the semiconductor device of the first embodiment.

As illustrated in FIG. 13, in the region 1B, the low-concentration impurity region EX of the n type and the low-concentration impurity region EX of the p type are formed in the layer stack part of the semiconductor layer SL and the epitaxial layer EP on both sides of the gate electrode GE. For example, n-type impurities are introduced into the semiconductor layer SL on both sides of the gate electrode GE by using a photoresist film (not illustrated) having an opening in the region SN in the region 1B as a mask by the ion implantation method. The photoresist film (not illustrated) is removed by ashing process or the like. Subsequently, p-type impurities are introduced into the semiconductor layer SL on both sides of the gate electrode GE by using a photoresist film (not illustrated) having an opening in the region SP in the region 1B as a mask by the ion implantation method. The photoresist film (not illustrated) is removed by ashing process or the like.

Figure 14:
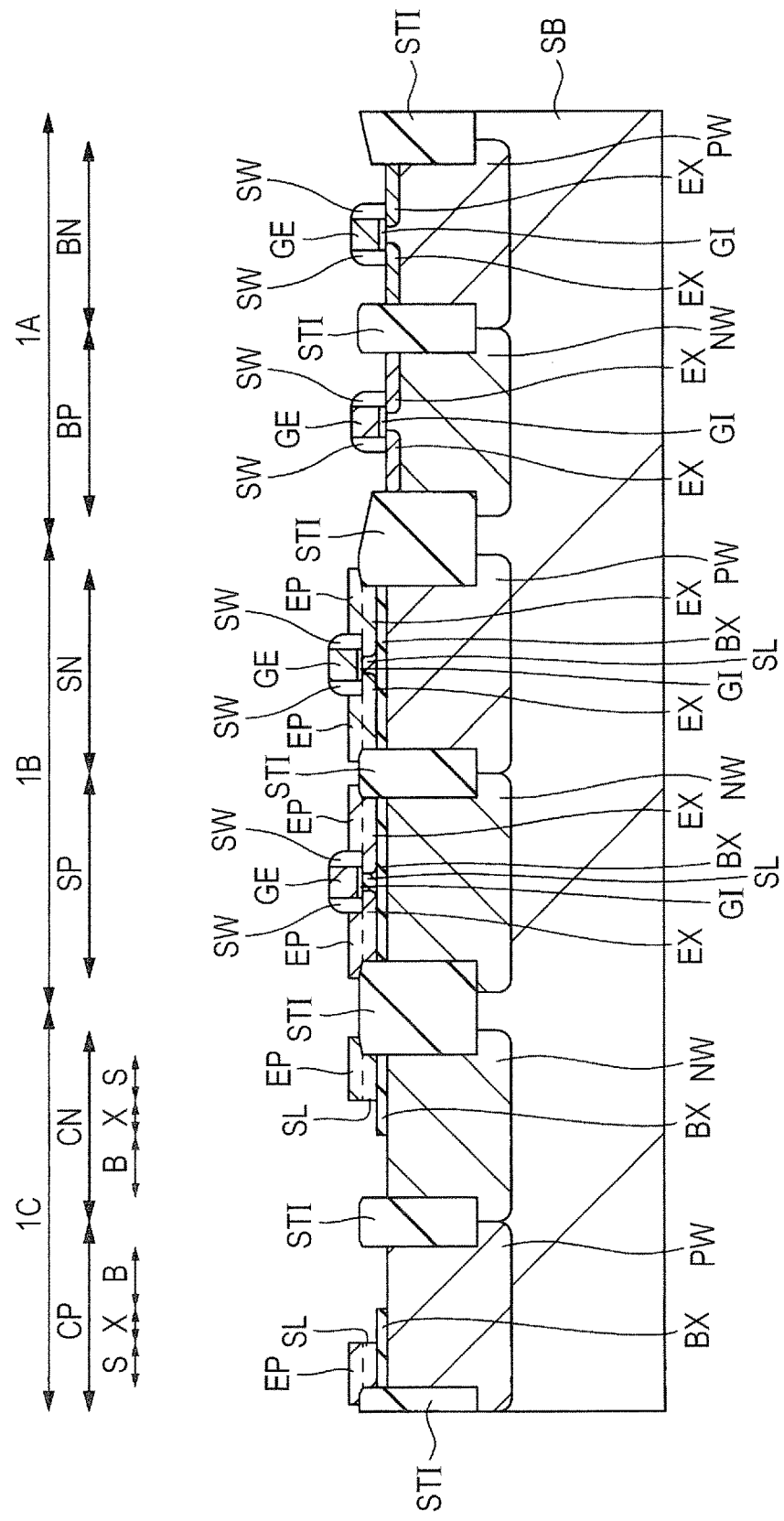
FIG. 14 is a cross section illustrating a process of manufacturing the semiconductor device of the first embodiment.

As illustrated in FIG. 14, the side-wall film SW made by an insulating film is formed on the side walls of the gate electrode GE in each region. For example, the insulating film is formed in the regions 1A and 1B and is subjected to anisotropic etching to make the side-wall film SW remain. The side-wall film may remain on the side walls of the layer stack part of the semiconductor layer SL and the epitaxial layer EP in the region 1C.

Figure 15:
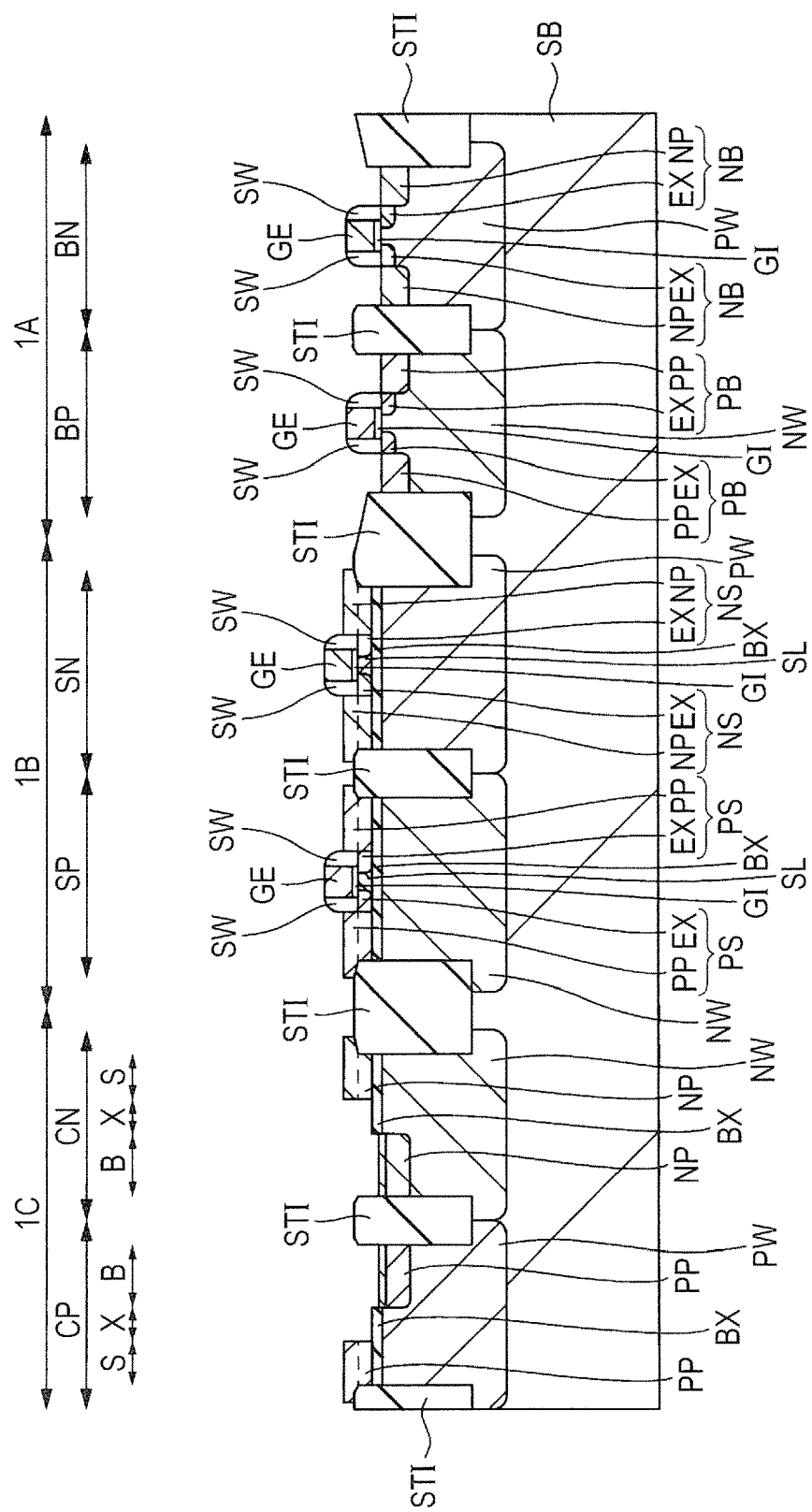
FIG. 15 is a cross section illustrating a process of manufacturing the semiconductor device of the first embodiment.

As illustrated in FIG. 15, the high-concentration impurity region NP of the n type and the high-concentration impurity region PP of the p type are formed in each of the regions.

For example, n-type impurities are introduced by the ion implantation method using a photoresist film (not illustrated) having openings in the region BN in the region 1A, the region SN in the region 1B, and the region CN in the region 1C as a mask by the ion implantation method. The photoresist film (not illustrated) is removed by ashing process or the like.

For example, p-type impurities are introduced by the ion implantation method using a photoresist film (not illustrated) having openings in the region BP in the region 1A, the region SP in the region 1B, and the region CP in the region 1C as a mask by the ion implantation method. The photoresist film (not illustrated) is removed by ashing process or the like. Subsequently, for example, by the RTA (Rapid Thermal Anneal) method, the ion-implanted impurities are activated.

As a result, in the region SN, a source/drain region NS of an SOI transistor of the n channel type made by the low-concentration impurity region EX of the n type and the high-concentration impurity region NP of the n type is formed. In the region BN, a source/drain region NB of a bulk transistor of the n channel type made by the low-concentration impurity region EX of the n type and the high-concentration impurity region NP of the n type is formed. Further, in the region CN, the high-concentration impurity region NP of the n type which becomes the lead part of the bottom electrode (n-type well NW) is formed. The regions may be formed one by one while varying the ion implantation condition of the high-concentration impurity region NP of the n type in the regions. In the region SP, a source/drain region PS of an SOI transistor of the p channel type made by the low-concentration impurity region EX of the p type and the high-concentration impurity region PP of the p type is formed. In the region BP, a source/drain region PB of a bulk transistor of the p channel type made by the low-concentration impurity region EX of the p type and the high-concentration impurity region PP of the p type is formed. Further, in the region CP, the high-concentration impurity region PP of the p type which becomes the lead part of the bottom electrode (p-type well PW) is formed. The regions may be formed one by one while varying the ion implantation condition of the high-concentration impurity region PP of the p type in the regions.

Figure 16:
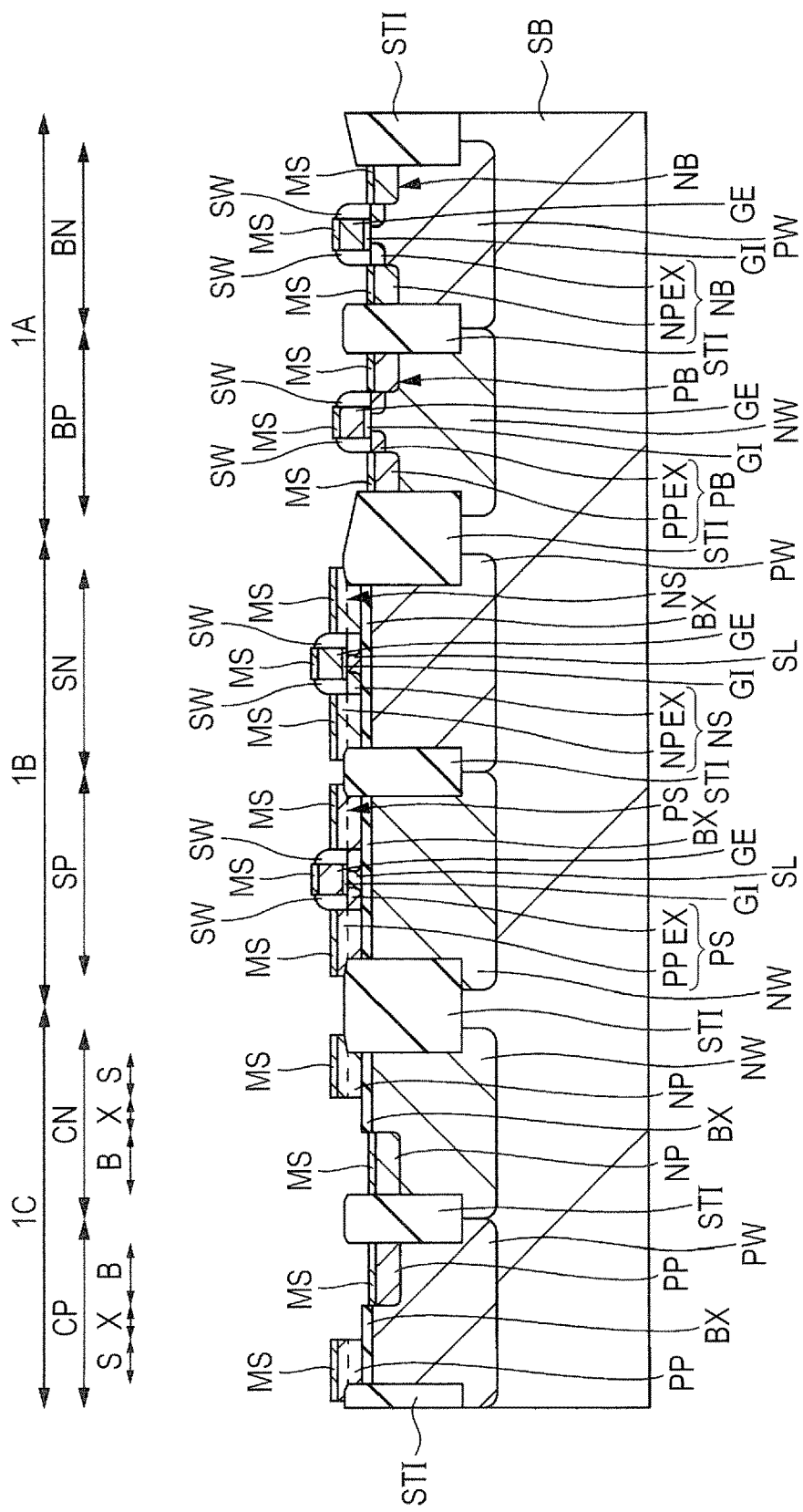
FIG. 16 is a cross section illustrating a process of manufacturing the semiconductor device of the first embodiment.

As illustrated in FIG. 16, over the gate electrode GE, and the high-concentration impurity region NP of the n type, and the high-concentration impurity region PP of the p type, the metal silicide film MS is formed by the salicide (Self Aligned Silicide) technique. As the metal silicide filmMS, for example, a nickel silicide film is formed. For example, a metal film such as a nickel (Ni) film is formed in the regions 1A, 1B, and 1C and is subjected to thermal process. By the process, silicidation reaction is caused in a contact region of the gate electrode GE, the high-concentration impurity region NP of the n type, the high-concentration impurity region PP of the p type, and the Ni film. After that, by removing the Ni film which is unreacted, a nickel silicide film is formed.

Figure 17:
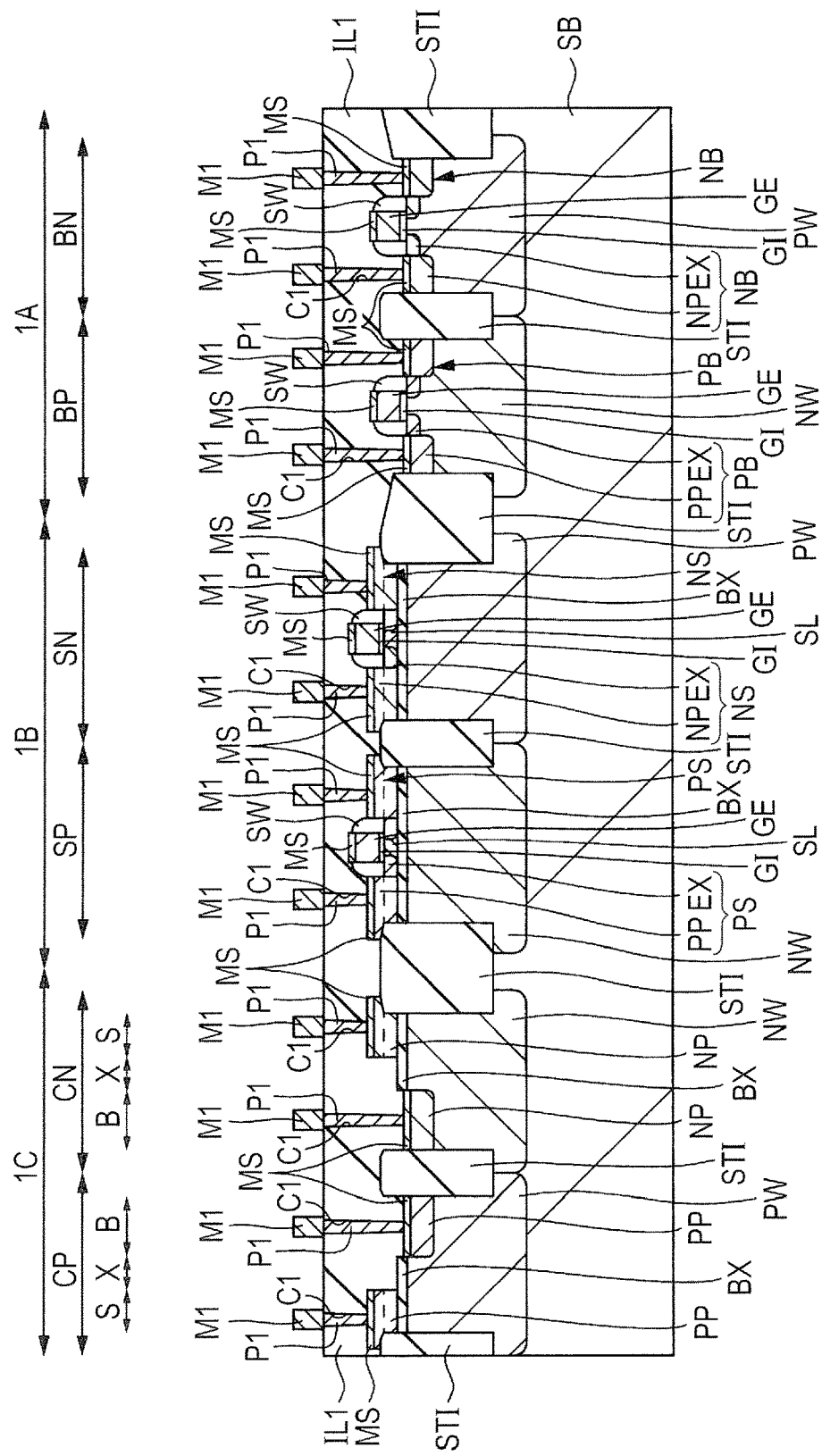
FIG. 17 is a cross section illustrating a process of manufacturing the semiconductor device of the first embodiment.

As illustrated in FIG. 17, the interlayer insulating film IL1, the plug P1, and the wire M1 are formed in each of the regions. First, in the regions 1A, 1B, and 1C, a layer stack film of a thin silicon nitride film (not illustrated) and a silicon oxide film is formed as the interlayer insulating film IL1 by the CVD method or the like.

By patterning the interlayer insulating film IL1, the coupling holes C1 are formed. Over the interlayer insulating film IL1 including the inside of the coupling holes C1, a layer stack film of a barrier film (not illustrated) and a metal film (for example, a tungsten film) is deposited as a conductive film. The deposited conductive film other than the conductive film in the coupling holes C1 is removed by using the CMP method or the like. By burying the coupling holes C1 with the conductive film as described above, the plugs P1 are formed. Subsequently, the wires M1 are formed over the interlayer insulating film IL1 including the top of the plugs P1. For example, a conductive film such as an Al film is deposited over the interlayer insulating film IL1 including the plugs P1 and patterned, thereby forming the wires M1. The wires M1 may be formed by the damascene method. For example, by forming an insulating film over the interlayer insulating film IL1 and patterning it, a wire trench is formed. After that, by burying the wire trench with a conductive film such as a copper film, the wire M1 is formed.

In a manner similar to the interlayer insulating film IL1, the plugs P1, and the wires M1, the interlayer insulating films (IL2 to IL5), the plugs (P2 to P5), and the wires (M2 to M5) above the wire M1 are formed. By repeating the formation of the interlayer insulating film, the plugs, and the wires as described above, a wire of larger number of layers is formed (refer to FIG. 1).

Subsequently, above, the wire M5 as the highest-layer wire, the insulating film PSN made by a silicon nitride film or the like is famed and patterned, thereby exposing a part of the highest-layer wire M5. The exposed part becomes the pad electrode PE. After that, the protection film RF made of photosensitive polyimide is formed over the insulating film PSN, and the protection film RF over the pad electrode PE is removed (refer to FIG. 1).

By the above process, the semiconductor device of the embodiment can be formed.

As described above, in the embodiment, the configuration part of the capacitive element and the configuration part of the SOI transistor and the bulk transistor can be simultaneously formed. Consequently, a capacitive element of high capacitance can be formed with an SOI transistor and a bulk transistor in a short process.

Second Embodiment

In a second embodiment, a formation region (region S) of the insulating layer BX constructing a capacitance insulating film of a capacitive element is defined by the element isolation part STI. With the configuration, the characteristic of the insulating layer BX as a capacitance insulating film can be improved. That is, variations in the formation regions of the insulating layer BX which becomes the capacitance insulating film, variations in the film thickness, and the like are suppressed, and adjustment of the capacitance becomes easier.

In the region CP in which a p-type capacitive element is formed, a deep n-type well DNW is formed below the p-type well PW. With the configuration, the p-type well PW as a component of the bottom electrode of the capacitive element can be electrically isolated from the p-type supporting board SB. Therefore, for example, the potential of the p-type well PW as a component of the bottom electrode can be set to a potential other than the substrate potential (for example, ground potential).

In the regions SN and BN, the deep n-type well DNW may be formed below the p-type well PW. With the configuration, the potential of the p-type well PW below each transistor can be set to a potential other than the substrate potential (for example, ground potential).

Hereinafter, the configuration of the semiconductor device of the embodiment will be described in more detail.

Description of Structure

Figure 18:
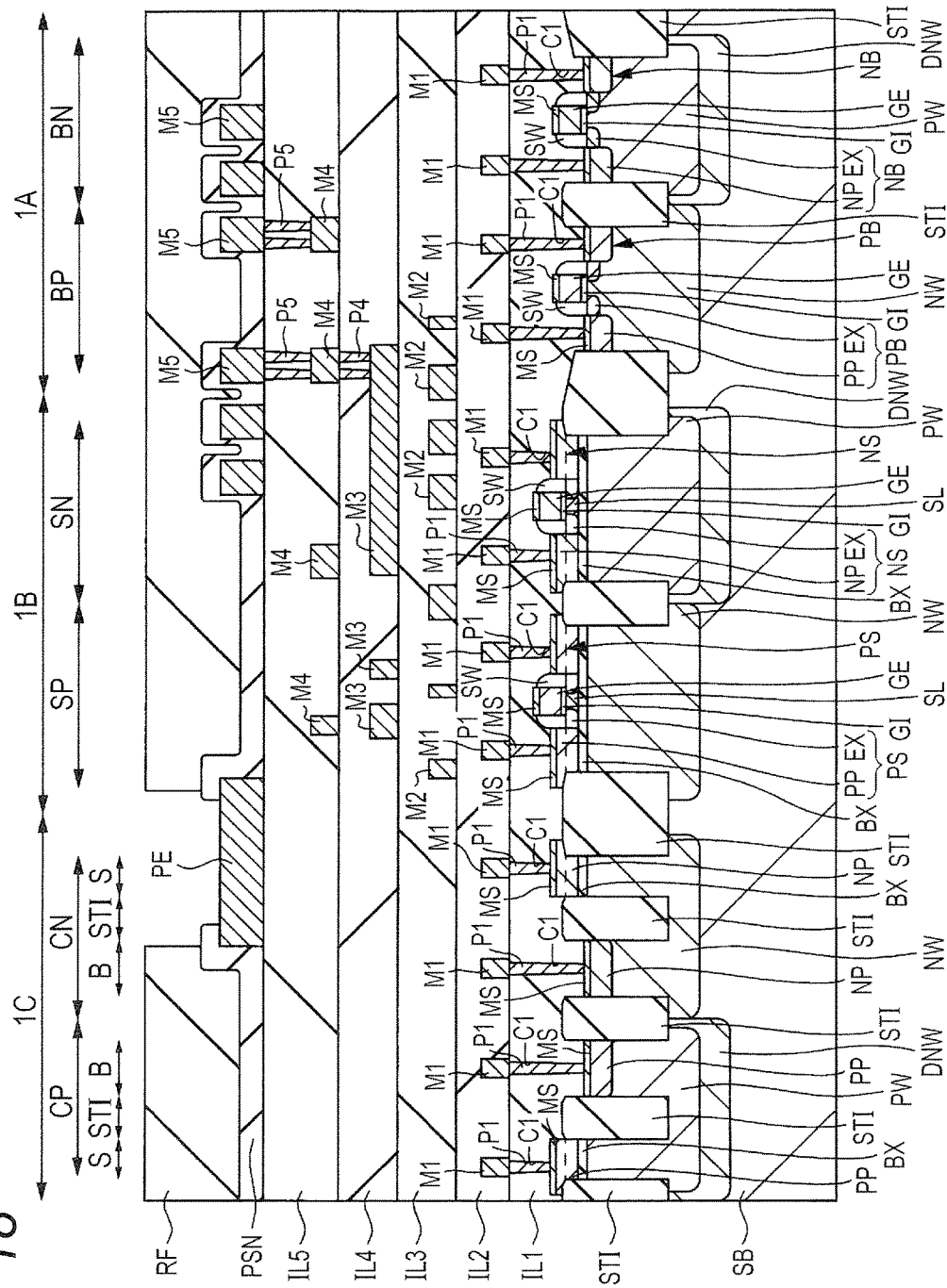
FIG. 18 is a cross section illustrating the configuration of a semiconductor device of a second embodiment.
Figure 19A:
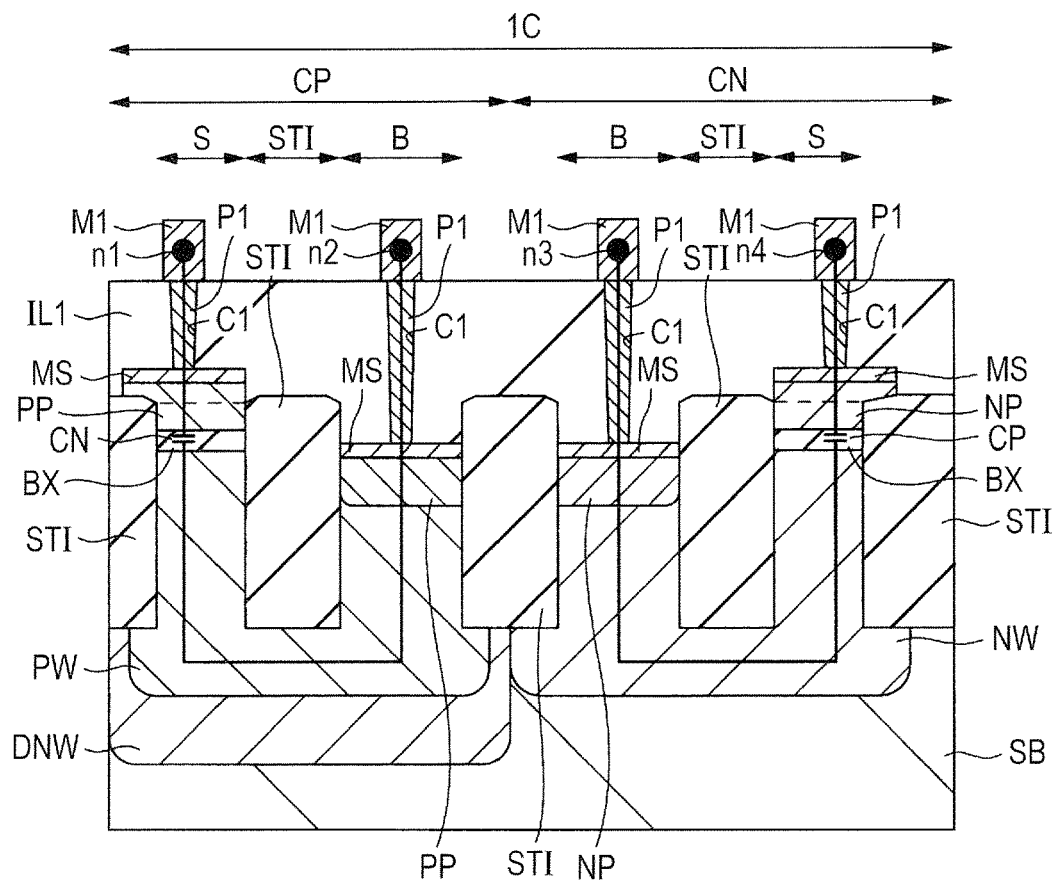
FIGS. 19A and 19B are a cross section and a plan view illustrating the configuration of a capacitive element in the semiconductor device of the second embodiment.
Figure 19B:
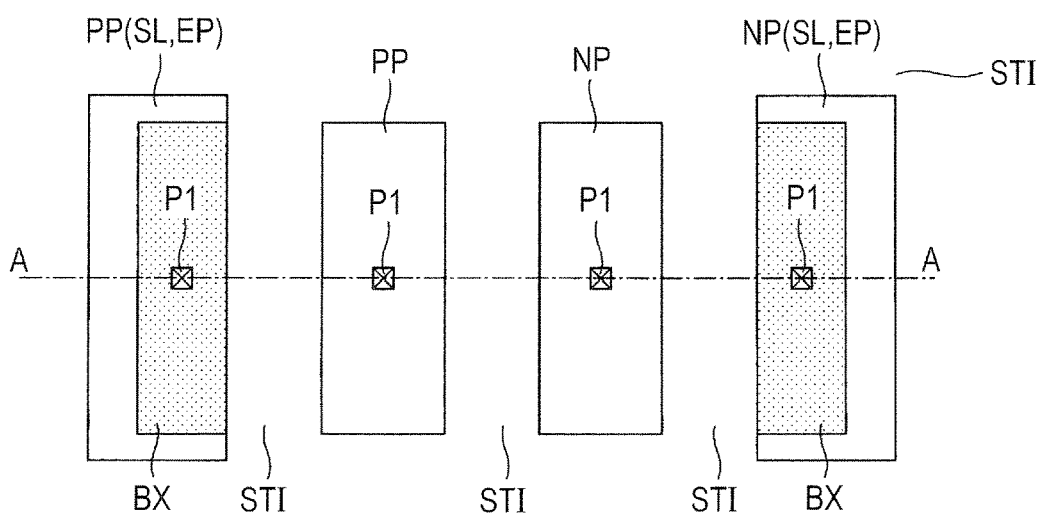

FIG. 18 is a cross section illustrating the configuration of the semiconductor device of the embodiment. FIGS. 19A and 19B are a cross section and a plan view illustrating the configuration of a capacitive element in the semiconductor device of the embodiment. FIG. 19A is a cross section, and FIG. 19B is a plan view. FIG. 19A corresponds to the A-A section in FIG. 19B.

In a manner similar to the case of the first embodiment, the semiconductor device of the second embodiment is formed by using an SOI substrate and has an SOI transistor, a bulk transistor, and a capacitive element. Hereinafter, description of configurations similar to those of the first embodiment will not be repeated.

(1) Configuration of SOI Transistor

The configuration of an SOI transistor of an n-channel type and that of an SOI transistor of a p-channel type is similar to that of the case of the first embodiment (refer to FIGS. 18 and 1).

Below the insulating layer BX of the SOI transistor of the n channel type, that is, in the supporting board SB in the region SN, the p-type well PW is formed. The impurity concentration of the p-type well PW is higher than that of the supporting board SB. Below the p-type well PW, the deep n-type well DNW is formed. That is, the side faces and the bottom face of the p-type well PW are covered with the element isolation parts STI and the deep n-type well DNW.

(2) Configuration of Bulk Transistor

The configuration of the bulk transistor of the n-channel type and the bulk transistor of the p-channel type is similar to that in the case of the first embodiment (refer to FIGS. 18 and 1).

Below the p-type well PW in the region BN in which the bulk transistor of the n-channel type is formed, the deep n-type well DNW is formed. That is, the side faces and the bottom face of the p-type well PW are covered with the element isolation parts STI and the deep n-type well DNW.

(3) Configuration of Capacitive Element

The configuration of two capacitive elements (an n-type capacitive element and a p-type capacitive element) formed in the region 1C is similar to that in the case of the first embodiment (refer to FIGS. 18 and 1) except for the point that the insulating layer BX is defined by the element isolation part STI and the point that the deep n-type well DNW is formed.

The capacitive element (n-type capacitive element) is formed in the region CN. In a manner similar to the case of the first embodiment, the capacitive element (n-type capacitive element) has the supporting board SB, the insulating layer BX formed over the supporting board SB, and the semiconductor layer SL formed over the insulating layer BX. In the supporting board SB in the region CN, the n-type well NW is formed.

The insulating layer BX is formed in an active region surrounded (defined) by the element isolation parts STI (refer to FIG. 19B). In the region CN, a lead part of a bottom electrode made by the high-concentration impurity region NP of the n type is formed in the active region surrounded (defined) by the element isolation parts STI (refer to FIG. 19B). The bottom of the insulating layer BX and the lead part (high-concentration impurity region NP of the n type) of the bottom electrode are electrically coupled via the n-type well NW below the element isolation parts STI.

As described above, in the region CN, by defining the formation region of the insulating layer BX by the element isolation parts STI, variations in the formation region of the insulating layer BX which becomes a capacitance insulating film, variations in the film thickness, and the like can be suppressed.

Figure 20:
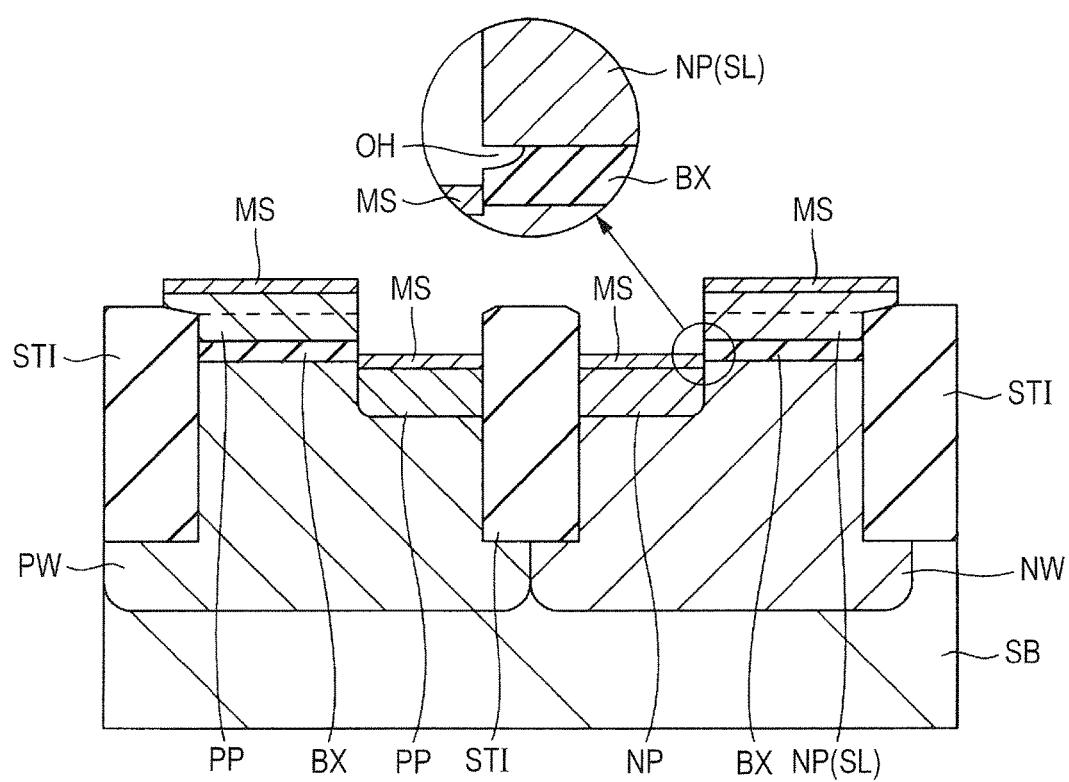
FIG. 20 is a cross section illustrating the configuration of a semiconductor device of a comparative example of the second embodiment.

For example, as illustrated in FIG. 20, there is a case that an overhang part OH occurs at an end part of the insulating layer BX depending on processing (etching) precision of the semiconductor layer SL and the insulating layer BX. In such a case, the characteristic of the capacitive element is fluctuated and it becomes difficult to adjust the capacitance.

On the other hand, in the embodiment, since the insulating layer BX which becomes the capacitance insulating film is defined by the element isolation parts STI, the end part of the insulating layer BX is protected by the element isolation parts STI, and variations in the characteristic of the capacitive element can be reduced. In the first embodiment, to suppress occurrence of the overhang part OH as described above, the insulating layer BX which becomes the capacitance insulating film is made remain largely so as to be longer than the semiconductor layer SL which becomes the top electrode. By setting the process (etching) of the semiconductor layer SL and the process (etching) of the insulating layer BX as different processes, the process precision is improved. FIG. 20 is a cross section illustrating the configuration of a semiconductor device of a comparative example of the second embodiment.

The capacitive element (p-type capacitive element) is formed in the region CP. In a manner similar to the case of the first embodiment, a capacitive element (p-type capacitive element) has the supporting board SB, the insulating layer BX formed over the supporting board SB, and the semiconductor layer SL formed over the insulating layer BX. In the supporting board SB in the region CP, the p-type well PW is formed.

The insulting layer BX is formed in the active region surrounded (defined) by the element isolation part STI (refer to FIG. 19B). In the region CP, the lead part of the bottom electrode made by the high-concentration impurity region PP of the p type is formed in the active region surrounded (defined) by the element isolation part STI (refer to FIG. 19B). The bottom of the insulating layer BX and the lead part (high-concentration impurity region PP of the p type) of the bottom electrode are electrically coupled via the p-type well PW below the element isolation parts STI.

As described above, in the region CP, by defining the formation region of the insulating layer BX by the element isolation parts STI, in a manner similar to the case of the n-type capacitive element, variations in the formation region of the insulating layer BX which becomes a capacitance insulating film, variations in the film thickness, and the like can be suppressed.

Below the p-type well PW in the region CP in which the p-type capacitive element is formed, the deep n-type well DNW is formed. That is, the side faces and the bottom face of the p-type well PW are covered with the element isolation parts STI and the deep n-type well DNW.

By providing the deep n-type well DNW below the p-type well PW as described above, the potential of the p-type well PW as a component of the bottom electrode can be set to a potential other than the substrate potential (for example, ground potential).

The configurations of the interlayer insulating film (IL1 to IL5), the plugs (P1 and the like), and the wire (M1 to M5) are similar to those in the case of the first embodiment. The configurations of the insulating film PSN, the protection film RF, and the pad electrode PE are also similar to those in the case of the first embodiment.

The processes of the semiconductor device of the second embodiment are similar to those in the case of the first embodiment except for the process of forming the element isolation part STI and the process of forming the deep n-type well DNW.

For example, at the time of forming the element isolation part STI in the SOI substrate, it is sufficient to form the element isolation part STI so as to surround the formation region of the insulating layer BX in the region CP (refer to FIGS. 4 and 18).

In a well formation process, it is sufficient to form the deep n-type well DNW in addition to the p-type well and the n-type well NW. Concretely, using a photoresist film (not illustrated) in which a formation region of the deep n-type well DNW is opened as a mask, n-type impurities are ion-implanted into a deep position in the supporting board SB below the insulating layer BX. Subsequently, the photoresist film is removed by asking process of the like.

Although the order of forming the above-described wells (PW, NW, and DNW) is not limited, for example, the deep n-type well DNW is formed, the p-type well is formed (refer to FIG. 5) and, further, the n-type well NW is formed (refer to FIG. 6).

The following processes are similar to those in the case of the first embodiment (refer to FIGS. 7 to 17).

Third Embodiment

In a third embodiment, in addition to an SOI transistor, a bulk transistor, and a capacitive element (n-type capacitive element and a p-type capacitive element), a varactor (MOS varactor, also called an MOS-type variable capacitive element) is provided.

Hereinafter, the semiconductor device of the third embodiment will be described in more detail with reference to the drawings.

Figure 21:
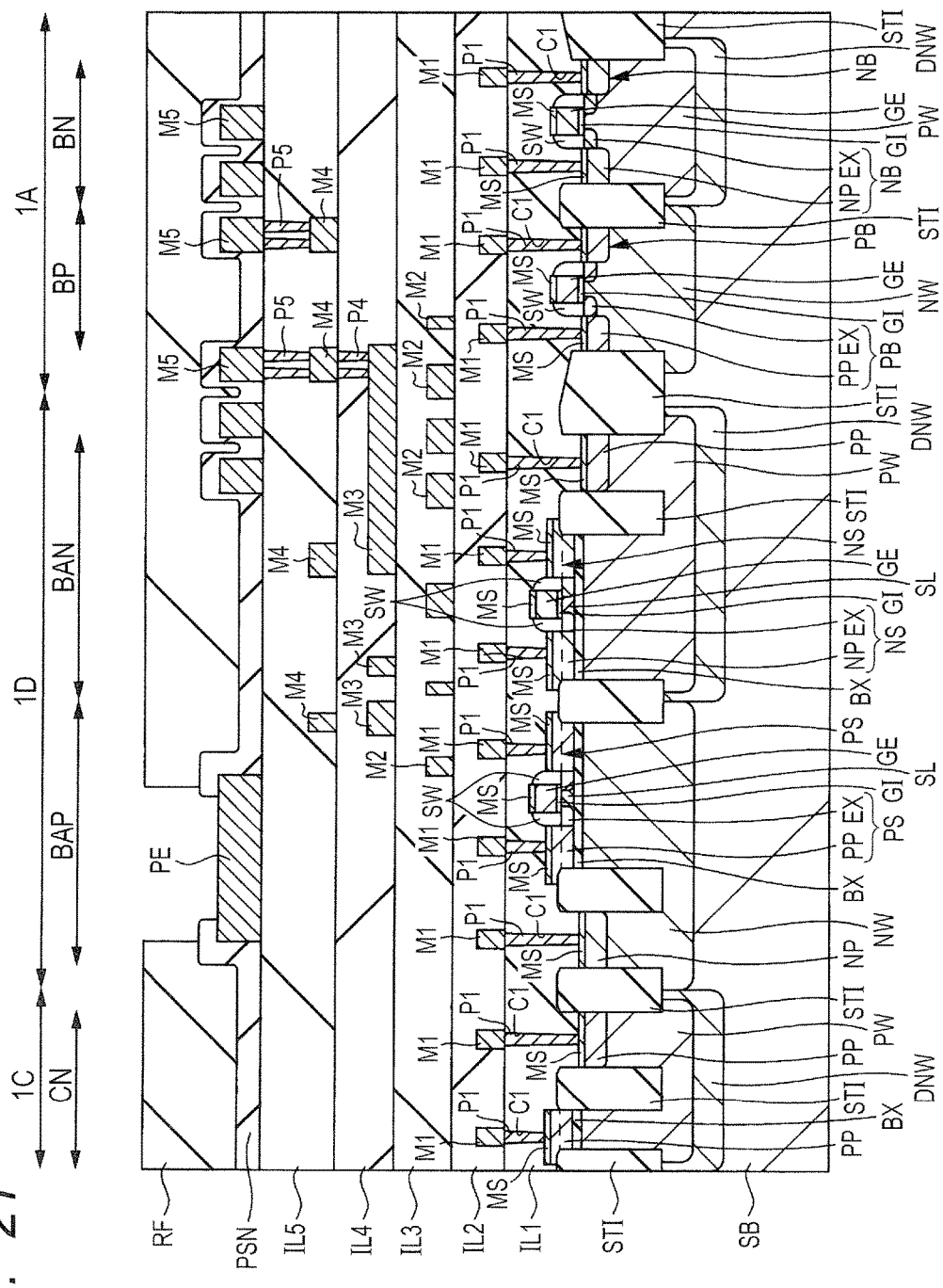
FIG. 21 is a cross section illustrating the configuration of a semiconductor device of a third embodiment.
Figure 22:
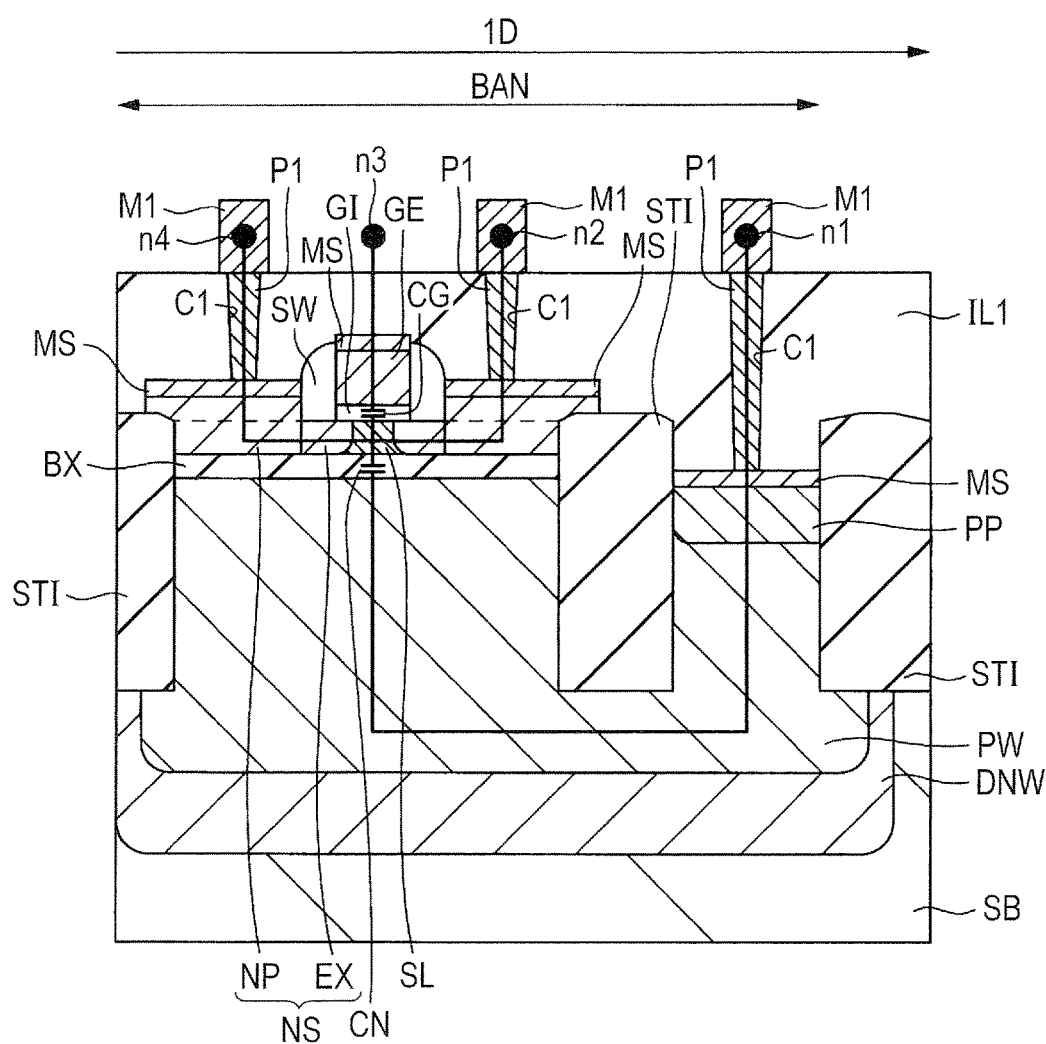
FIG. 22 is a cross section illustrating the configuration of a capacitive element in the semiconductor device of the third embodiment.
Figure 23:
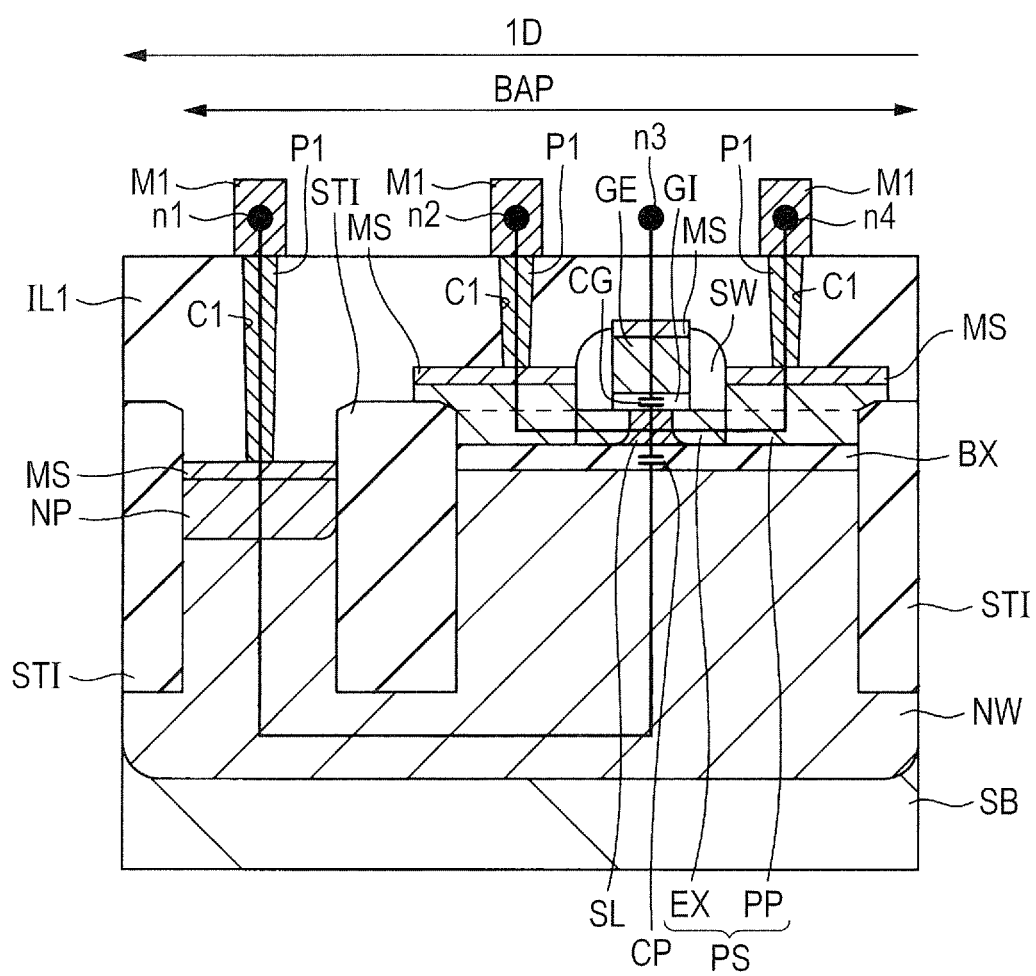
FIG. 23 is a cross section illustrating the configuration of the capacitive element in the semiconductor device of the third embodiment.

The configuration of the semiconductor device of the embodiment will be described by using FIG. 21. FIG. 21 is a cross section illustrating the configuration of the semiconductor device of the third embodiment. FIGS. 22 and 23 are cross sections each illustrating the configuration of a capacitive element in the semiconductor device of the third embodiment.

The semiconductor device of the third embodiment is formed by using an SOI substrate and has an SOI transistor, a bulk transistor, a varactor, and a capacitive element.

In the embodiment, a region in which the SOI transistor is formed is set as "region 1B", the region in which the varactor transistor is formed is set as "region 1C", and the region in which the varactor is formed is set as "region 1D". In FIG. 21, however, the "region 1B" as the region in which the SOI transistor is formed is omitted.

In the region 1B, in a manner similar to the cases of the first and second embodiments, an SOI transistor of the n channel type and an SOI transistor of the p channel type are formed (refer to FIG. 1).

In the region 1B, in a manner similar to the cases of the first and second embodiments, a bulk transistor of the n channel type and a bulk transistor of the p channel type are formed.

In the region 1C, in a manner similar to the cases of the first and second embodiments, two capacitive elements (an n-type capacitive element and a p-type capacitive element) are formed. In FIG. 21, however, the p-type capacitive element formed in the region CP is omitted.

Since the configurations of the SOI transistor, the bulk transistor, and the capacitive elements (the n-type capacitive element and the p-type capacitive element) are similar to those in the cases of the first and second embodiments, hereinafter, the varactor formed in the region 1D will be described.

In the region 1D, an n-type varactor and a p-type varactor are formed. The n-type varactor and the p-type varactor have configurations similar to those of the SOI transistor of the n-channel type and the SOI transistor of the p-channel type, respectively, and can be formed by similar processes.

The n-type varactor (FIG. 21) is formed in an active region surrounded (defined) by the element isolation parts STI indicated by a region BAN. The n-type varactor has the gate electrode GE formed over the semiconductor layer SL via the gate insulating film GI and the source/drain region NS formed in the semiconductor layer SL on both sides of the gate electrode GE. On the side walls of the gate electrode GE, the side-wall film SW is formed. The source/drain region NS is a source/drain region of the LDD structure, and has the low-concentration impurity region EX of the n type formed in a self-aligned manner with respect to the gate electrode GE, and the high-concentration impurity region NP of the n type formed in a self-aligned manner with respect to the composite member of the gate electrode GE and the side-wall film SW. The impurity concentration of the high-concentration impurity region NP of the n type is higher than that of the low-concentration impurity region EX of the n type.

In the region BAN, the epitaxial layer (EP) is arranged over the semiconductor layer SL on both sides of the gate electrode GE, and the high-concentration impurity region NP of the n type is formed in the layer stack part.

Below the insulating layer BX of the n-type varactor, that is, in the supporting board SB in the region BAN, the p-type well PW is formed. The impurity concentration of the p-type well PW is higher than that of the supporting board SB. In the p-type well, the high-concentration impurity region PP of the p type is formed. The high-concentration impurity region PP of the p type is formed in a bulk region (the region from which the insulating layer BX and the semiconductor layer SL over the supporting board SB are removed) in the region BAN. Below the p-type well PW, the deep n-type well DNW is formed. That is, the side faces and the bottom face of the p-type well PW are covered with the element isolation parts STI and the deep n-type well DNW.

In the region 1D (BAN), over the source/drain region NS and the well lead part (the high-concentration impurity region PP of the p type in the supporting board (p-type well PW)), the plug P1 is formed via the metal silicide film MS.

In this case, by turning on the n-type varactor (that is, the potential difference is given between the nodes n4 and n2 and potential is applied to the node n3) to make the potential of the node n3 and that of the node n1 the same, a MOS capacitor CG obtained by the oxide film of the gate and the capacitor CN obtained by the insulating layer BX are coupled in parallel between the node n2 (n4) and the node n3 (n1). By adding the two capacitors, the capacitance per unit area is further increased, and the range of adjustment of the capacitance is widened.

The p-type varactor (FIG. 21) is formed in the active region surrounded (defined) by the element isolation part STI indicated by a region BAP. The p-type varactor has the gate electrode GE formed over the semiconductor layer SL via the gate insulating film GI and the source/drain region PS formed in the semiconductor layer SL on both sides of the gate electrode GE. On the side walls of the gate electrode GE, the side-wall film SW is formed. The source/drain region PS is a source/drain region of the LDD structure, and has the low-concentration impurity region EX of the p type formed in a self-aligned manner with respect to the gate electrode GE, and the high-concentration impurity region PP of the p type formed in a self-aligned manner with respect to the composite member of the gate electrode GE and the side-wall film SW. The impurity concentration of the high-concentration impurity region PP of the p type is higher than that of the low-concentration impurity region EX of the p type.

In the region BAP, the epitaxial layer (EP) is arranged over the semiconductor layer SL on both sides of the gate electrode GE, and the high-concentration impurity region PP of the p type is formed in the layer stack part.

Below the insulating layer BX of the p-type varactor, that is, in the supporting board SB in the region BAP, the n-type well NW is formed. In the n-type well NW, the high-concentration impurity region of the n type is formed. The high-concentration impurity region NP of the n type is formed in a bulk region (the region from which the insulating layer BX and the semiconductor layer SL over the supporting board SB are removed) in the region BAP.

The gate electrode GE is made by, for example, a polycrystal silicon film, and the gate insulating film GI is made by, for example, a silicon oxide film.

In an upper part of the gate electrode GE and an upper part (surface layer part) of the high-concentration impurity regions (NP and PP) for the source and drain, the metal silicide film MS as a reaction layer (compound layer) of metal and semiconductor is formed.

The interlayer insulating film IL1 is formed over the gate electrode GE, the source/drain regions (NS and PS) and the like. Over the source/drain regions (NS and PS), the plug (coupling part) P1 is formed via the metal silicide film MS. The plug P1 is made by a conductive film buried in the connection hole C1 provided in the interlayer insulating film IL1. Over the plug P1, the wire M1 is formed.

In the region 1D (BAP), over the source/drain region PS and the well lead part (the high-concentration impurity region NP of the n type in the supporting board (n-type well NW) SB), the plug P1 is formed via the metal silicide film MS.

In this case, by turning on the p-type varactor (that is, the potential difference is given between the nodes n2 and n4 and potential is applied to the node n3) to make the potential of the node n3 and that of the node n1 the same, the MOS capacitor CG obtained by the oxide film of the gate and the capacitor CP obtained by the insulating layer BX are coupled in parallel between the node n2 (n4) and the node n3 (n1). By adding the two capacitors, the capacitance per unit area is further increased, and the range of adjustment of the capacitance is widened.

By providing the deep n-type well DNW below the p-type well PW in the region BAN in which the n-type varactor is formed, the potential of the p-type well PW can be set to a potential other than the substrate potential (for example, the ground potential. That is, as described above, the potential of the node n3 and that of the node n1 can be made the same.

Fourth Embodiment
APPLICATION EXAMPLE 1

Figure 24A:
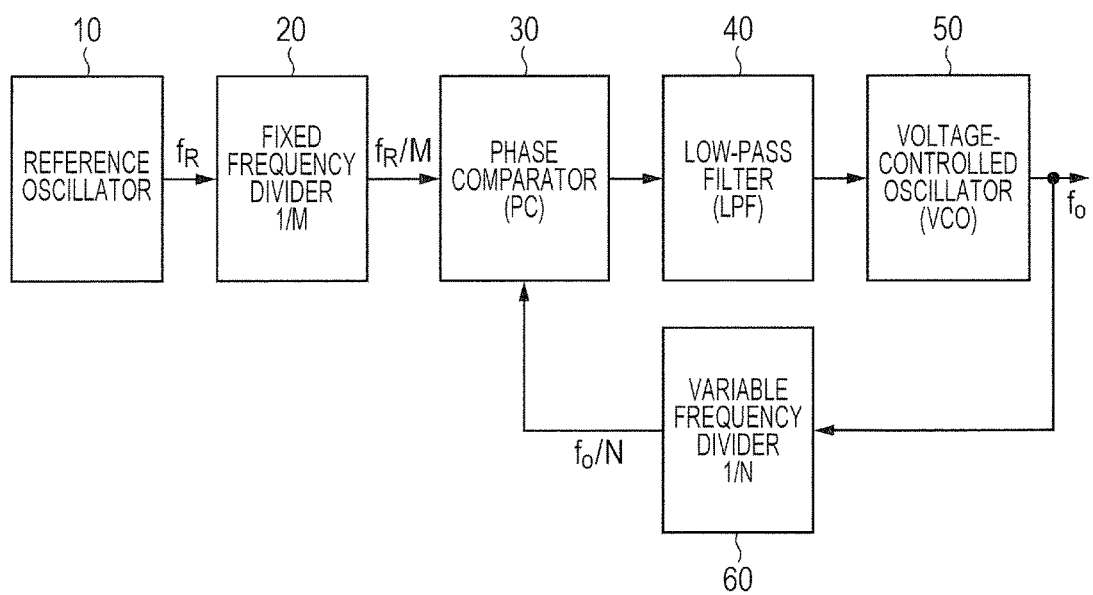
FIGS. 24A and 24B are circuit diagrams illustrating a PLL circuit and a low-pass filter in application example 1 of a fourth embodiment.
Figure 24B:
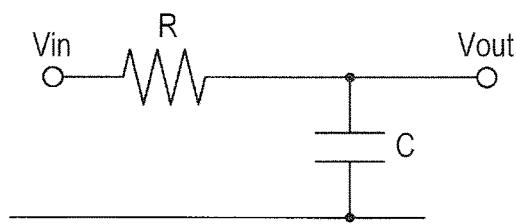

The capacitive elements (n-type capacitive element and p-type capacitive element) and the varactor described in the first to third embodiments can be used for a low-pass filter of a PLL (Phase Locked Loop) circuit. FIGS. 24A and 24B are circuit diagrams illustrating a PLL circuit and a low-pass filter in application example 1. FIG. 24A illustrates a PLL circuit and FIG. 24B illustrates a low-pass filter.

As illustrated in FIG. 24A, the PLL circuit has, for example, a reference oscillator 10, a fixed frequency divider (1/M) 20, a phase comparator (PC) 30, a low-pass filter (LPF) 40, a voltage-controlled oscillator (VOC) 50, and a variable frequency divider (1/N) 60. The PLL circuit is a feedback circuit for adjusting oscillation frequency fo of the voltage-controlled oscillator 50 to desired frequency $f_R$. For example, when output frequency of the voltage-controlled oscillator 50 becomes higher than a reference signal from a state where the frequency $f_R$=frequency fo, the high output frequency is supplied to the phase comparator 30 via the variable frequency divider 60 and converted to a voltage signal corresponding to high output frequency in the low-pass filter 40, and the voltage signal is output. By the voltage signal, the output frequency of the voltage-controlled oscillator 50 is lowered. The operation is repeated until the frequency $f_R$ becomes equal to the frequency fo ($f_R$=fo).

As illustrated in FIG. 24B, the low-pass filter 40 has a resistor R coupled between an input potential Vin and an output potential Vout and a capacitor C coupled between the output potential Vout and a reference potential.

As the capacitor C of the low-pass filter 40, the capacitive element (n-type capacitive element, p-type capacitive element) or the varactor described in the first to third embodiments can be used. By the capacitive element (n-type capacitive element, p-type capacitive element) or the varactor described in the first to third embodiments, a capacitor of high capacitance can be realized with small area, and is suitably used as the low-pass filter.

APPLICATION EXAMPLE 2

In the capacitive element (n-type capacitive element, p-type capacitive element) or the varactor described in the second and third embodiments, the p-type well PW is electrically isolated from the n-type supporting board SB by the deep n-type well DNW. Consequently, the device is not easily influenced by signal noise caused by operation of another circuit, and the operation characteristics become excellent. For example, the device is suitably used for a circuit for high-speed data transfer of multiple channels, the PLL circuit described in the application example 1, an AD converter, and the like.

APPLICATION EXAMPLE 3

The n-type varactor and the p-type varactor described in the third embodiment may be coupled in parallel and used as a capacitor. In this case, the n-type varactor and the p-type varactor operate in a complementary manner in correspondence to fluctuations in potential, and stability of the capacitor can be improved.

Figure 25A:
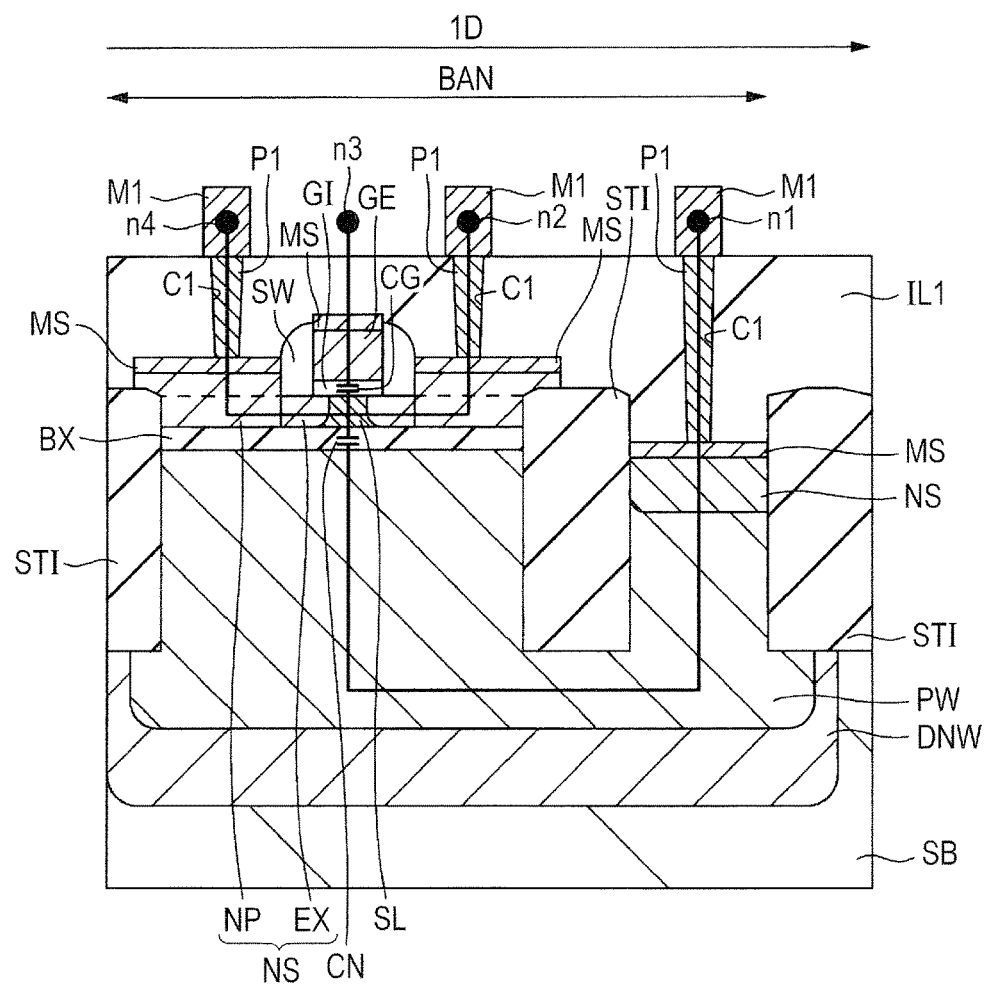
FIGS. 25A, 25B, and 25C are a cross section, a circuit diagram, and a capacitance change graph, respectively, illustrating an n-type varactor unit of application example 3 of the fourth embodiment.
Figure 25B:
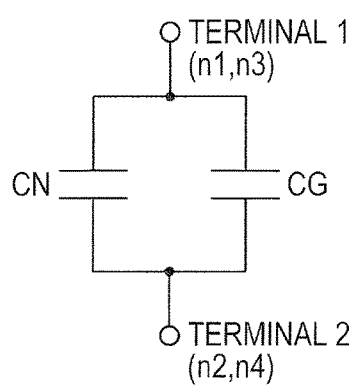
Figure 25C:
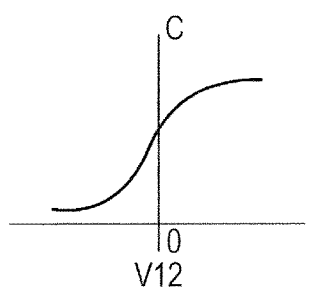
Figure 26A:
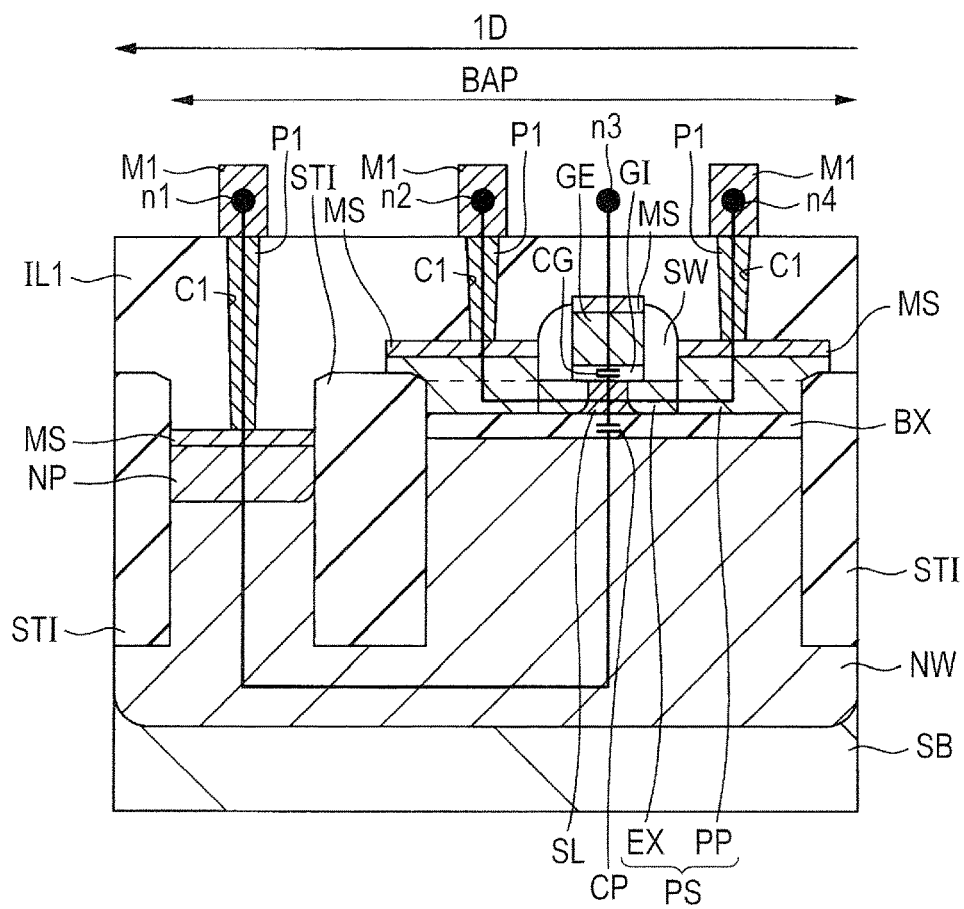
FIGS. 26A, 26B, and 26C are a cross section, a circuit diagram, and a capacitance change graph, respectively, illustrating a p-type varactor unit of the application example 3 of the fourth embodiment.
Figure 26B:
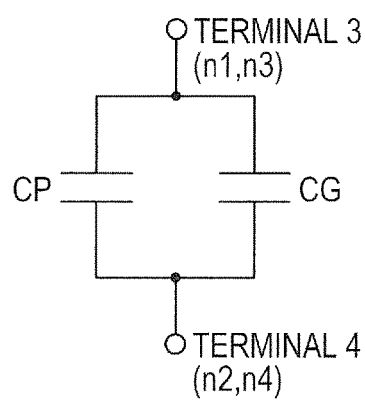
Figure 26C:
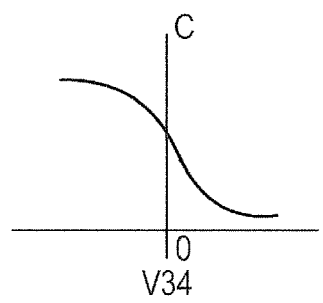
Figure 27A:
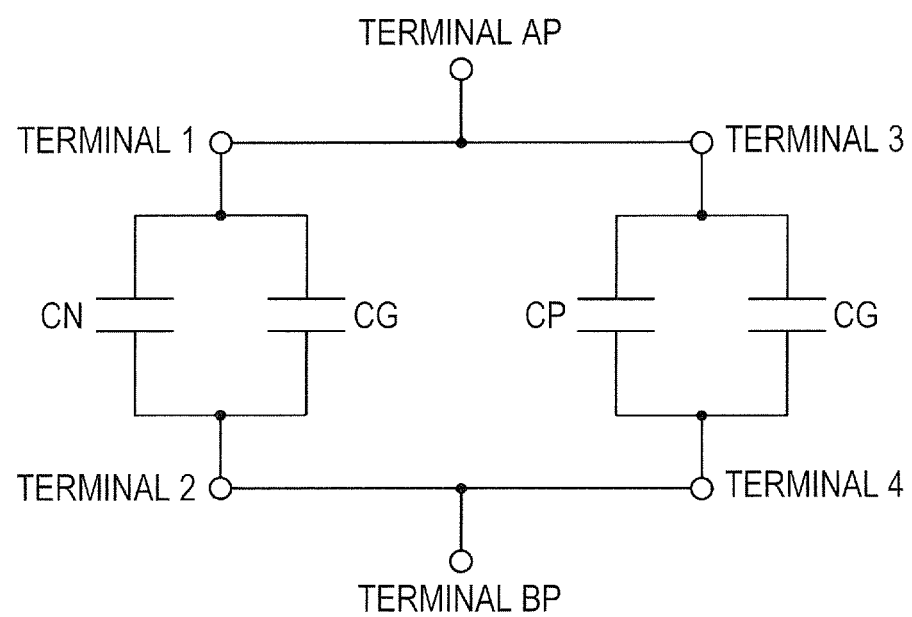
FIGS. 27A and 27B are a circuit diagram and a capacitance change graph illustrating a capacitive element of the application example 3 of the fourth embodiment.
Figure 27B:
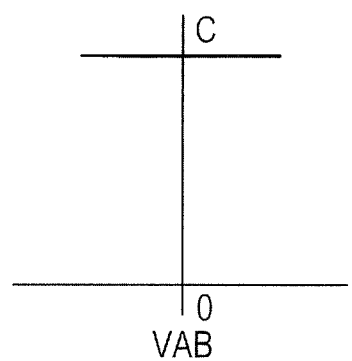

FIGS. 25A, 25B, and 25C are a cross section, a circuit diagram, and a capacitance change graph illustrating an n-type varactor unit of the application example 3. FIG. 25A is the cross section, FIG. 25B is the circuit diagram, and FIG. 25C is the capacitance change graph. FIGS. 26A, 26B, and 26C are a cross section, a circuit diagram, and a capacitance change graph illustrating a p-type varactor unit of the application example 3. FIG. 26A is the cross section, FIG. 26B is the circuit diagram, and FIG. 26C is the capacitance change graph. FIGS. 27A and 27B are a circuit diagram and a capacitance change graph illustrating a capacitive element of the application example 3. FIG. 27A is the circuit diagram, and FIG. 27B is the capacitance change graph.

The configuration of the n-type varactor and the p-type varactor illustrated in FIGS. 25A and 25B is as described in the third embodiment. As illustrated in FIG. 25B, in the case of coupling the nodes n3 and n1 and turning on the n-type varactor (that is, the potential difference is given between the nodes n4 and n2 and potential is applied to the node n3), a MOS capacitor CG obtained by the oxide film of the gate and the capacitor CN obtained by the insulating layer BX are coupled in parallel between the terminal 1 (n3, n1) and the terminal 2 (n2, n4). In this case, as illustrated in FIG. 25C, the capacitance C (vertical axis) increases as a potential V12 between the terminals 1 and 2 (horizontal axis) becomes higher.

On the other hand, as illustrated in FIG. 26B, in the case of coupling the nodes n3 and n1 and turning on the p-type varactor (that is, the potential difference is given between the nodes n4 and n2 and potential is applied to the node n3), the MOS capacitor CG obtained by the oxide film of the gate and the capacitor CP obtained by the insulating layer BX are coupled in parallel between the terminal 3 (n3, n1) and the terminal 4 (n2, n4). In this case, as illustrated in FIG. 26C, the capacitance C (vertical axis) decreases as a potential V34 between the terminals 3 and 4 (horizontal axis) becomes higher.

Therefore, as illustrated in FIG. 27A, by coupling the terminals 1 and 3 and coupling the terminals 2 and 4, when the n-type varactor and the p-type varactor are coupled in parallel, the MOS capacitor CG obtained by the oxide film of the gate and the capacitor CN obtained by the insulating layer BX in the n-type varactor and the MOS capacitor CG obtained by the oxide film of the gate and the capacitor CP obtained by the insulating layer BX in the p-type varactor are coupled in parallel. In the case where the coupling part of the terminals 1 and 3 is set as the terminal AP and the coupling part of the terminals 2 and 4 is set as the terminal BP, as illustrated in FIG. 27B, the composite capacitance becomes almost constant regardless of changes in the potential VAB (horizontal axis) between the terminals AP and BP.

Although the present invention achieved by the inventors herein has been concretely described on the basis of the embodiments, obviously, the present invention is not limited to the foregoing embodiments but can be variously changed without departing from the gist.

What is claimed is:

1. A semiconductor device comprising:
an SOI substrate having a supporting board, an insulating layer formed on the supporting board, and a semiconductor layer formed on the insulating layer;
a capacitive element formed in a first active region of the SOI substrate; and
a first MISFET formed in a second active region of the SOI substrate, which is different from the first active region,
wherein the first active region includes:
an SOI region having a first portion of the supporting board in the first active region, a first portion of the insulating layer in the first active region and the semiconductor layer in the first active region, and
a bulk region having a second portion of the supporting board in the first region,
wherein the first MISFET includes:
a first gate electrode formed on the semiconductor layer in the second active region via a first gate insulating film,
a first source region formed in the semiconductor layer in the second active region, and formed on one side of the first gate electrode, and
a first drain region formed in the semiconductor layer in the second active region, and formed on the other side of the first gate electrode,
wherein the capacitive element includes:
a top electrode made of the semiconductor layer in the first active region,
a capacitance insulating film made of the first portion of the insulating layer in the first active region,
a bottom electrode made of a well formed in the supporting board in the first active region, and
a lead part of the bottom electrode made of an impurity region formed in the well in the second portion of the supporting board in the first active region, and
wherein each of the first active region and the second active region is surrounded by an element isolation part without intervening the element isolation part between the SOI region and the bulk region.

2. The semiconductor device according to claim 1, further comprising:
a third active region surrounded by the element isolation part; and
a second MISFET formed in the third active region of the SOI substrate, which is different from the first and second active regions, and
wherein the second MISFET includes:
a second gate electrode formed on the supporting board in the third active region, which is exposed by removing the semiconductor layer in the third active region and the insulating layer in the third active region, via a second gate insulating film,
a second source region formed in the supporting board in the third active region, and formed on one side of the second gate electrode, and
a second drain region formed in the supporting board in the third active region, and formed on the other side of the second gate electrode.

3. The semiconductor device according to claim 1, wherein capacitance of the capacitive element is determined by an overlap region of the well formed in the supporting board in the first active region and the semiconductor layer in the first active region.

4. The semiconductor device according to claim 2, wherein the top electrode is a first semiconductor region containing impurity of the same conduction type as that of each of the first source region and the first drain region.

5. The semiconductor device according to claim 4, wherein the lead part of the bottom electrode is a second semiconductor region containing impurity of the same conduction type as that of each of the second source region and the second drain region.

6. The semiconductor device according to claim 5, further comprising:
an interlayer insulating film formed so as to cover the capacitive element, the first MISFET and the second MISFET;
a first coupling part formed in the interlayer insulating film, and electrically connected with the first semiconductor region, and
a second coupling part formed in the interlayer insulating film, and electrically connected with the second semiconductor region.

7. The semiconductor device according to claim 1,
wherein the first active region includes:
the SOI region,
the bulk region, and
an intervening region located between the SOI region and the bulk region, and
wherein the intervening region has:
a third portion of the supporting board in the first active region, and
a second portion of the insulating layer in the first active region.

8. A semiconductor device comprising:
an SOI substrate having a supporting board, an insulating layer formed on the supporting board, and a semiconductor layer formed on the insulating layer;
a capacitive element formed in a first active region of the SOI substrate; and
a first MISFET formed in a second active region of the SOI substrate, which is different from the first active region,
wherein the first active region includes:
an SOI region having a first portion of the supporting board in the first active region, a first portion of the insulating layer in the first active region and the semiconductor layer in the first active region, and
a bulk region having a second portion of the supporting board in the first active region,
wherein the first MISFET includes:
a first gate electrode formed on the semiconductor layer in the second active region via a first gate insulating film,
a first source region formed in the semiconductor layer in the second active region, and formed on one side of the first gate electrode, and
a first drain region formed in the semiconductor layer in the second active region, and formed on the other side of the first gate electrode, and wherein the capacitive element includes:
- a top electrode made of the semiconductor layer in the first active region,
- a capacitance insulating film made of the first portion of the insulating layer in the first active region,
- a bottom electrode made of a well formed in the supporting board in the first active region, and
- a lead part of the bottom electrode made of an impurity region formed in the well in the second portion of the supporting board in the first active region.

9. The semiconductor device according to claim 8, wherein each of the first active region and the second active region is surrounded by an element isolation part without intervening the element isolation part between the SOI region and the bulk region.

10. The semiconductor device according to claim 8, further comprising:
- a third active region surrounded by the element isolation part; and
- a second MISFET formed in the third active region of the SOI substrate, which is different from the first and second active regions, and wherein the second MISFET includes:
- a second gate electrode formed on the supporting board in the third active region, which is exposed by removing the semiconductor layer in the third active region and the insulating layer in the third active region, via a second gate insulating film,
- a second source region formed in the supporting board in the third active region, and formed on one side of the second gate electrode, and
- a second drain region formed in the supporting board in the third active region, and formed on the other side of the second gate electrode.

11. The semiconductor device according to claim 8, wherein capacitance of the capacitive element is determined by an overlap region of the well formed in the supporting board in the first active region and the semiconductor layer in the first active region.

12. The semiconductor device according to claim 10, wherein the top electrode is a first semiconductor region containing impurity of the same conduction type as that of each of the first source region and the first drain region.

13. The semiconductor device according to claim 12, wherein the lead part of the bottom electrode is a second semiconductor region containing impurity of the same conduction type as that of each of the second source region and the second drain region.

14. The semiconductor device according to claim 13, further comprising:
- an interlayer insulating film formed so as to cover the capacitive element, the first MISFET and the second MISFET;
- a first coupling part formed in the interlayer insulating film, and electrically connected with the first semiconductor region; and
- a second coupling part formed in the interlayer insulating film, and electrically connected with the second semiconductor region.

15. The semiconductor device according to claim 8, wherein the first active region includes:
- the SOI region,
- the bulk region, and
- an intervening region located between the SOI region and the bulk region, and wherein the intervening region has:
- a third portion of the supporting board in the first active region, and
- a second portion of the insulating layer in the first active region.

* * * * *